United States Patent [19]
Akiyama et al.

[11] Patent Number: 6,165,274
[45] Date of Patent: Dec. 26, 2000

[54] PLASMA PROCESSING APPARATUS AND METHOD

[75] Inventors: Kazuyoshi Akiyama; Tatsuyuki Aoike; Toshiyasu Shirasuna; Kazuhiko Takada, all of Nara; Ryuji Okamura; Hitoshi Murayama, both of Souraku-gun, all of Japan

[73] Assignee: Canon Kabushiki Kaisha, Tokyo, Japan

[21] Appl. No.: 09/184,044

[22] Filed: Nov. 2, 1998

[30]      Foreign Application Priority Data

Oct. 31, 1997  [JP]  Japan ................................. 9-316420

[51] Int. Cl.$^7$ .................................................. C23C 16/00
[52] U.S. Cl. ............. 118/724; 118/723 E; 118/723 MW
[58] Field of Search ...................... 118/724, 732, 118/723 EV, 723 AN; 165/80.1, 80.2, 65, 345

[56]              References Cited

U.S. PATENT DOCUMENTS

| 5,287,914 | 2/1994 | Hughes ................................. 165/80.1 |
| 5,439,715 | 8/1995 | Okamura et al. ....................... 118/724 |
| 5,597,623 | 1/1997 | Takai et al. ............................... 427/575 |
| 5,720,818 | 2/1998 | Donde et al. ......................... 118/723 E |

FOREIGN PATENT DOCUMENTS

| 60-186849 | 9/1985 | Japan . |
| 07273047 | 10/1995 | Japan . |

*Primary Examiner*—Gregory Mills
*Assistant Examiner*—Parviz Hassanzadeh
*Attorney, Agent, or Firm*—Fitzpatrick, Cella, Harper & Scinto

[57]                 ABSTRACT

A plasma processing apparatus for plasma-processing a substrate arranged in a reaction chamber using a high frequency power supplied by a high frequency power introduction means, wherein said high frequency power introduction means comprises a cathode electrode and a conductor portion capable of transmitting a high frequency power to said cathode electrode, said conductor portion being penetrated a wall of said reaction chamber while said conductor portion being electrically isolated from said wall of said reaction chamber by means of an insulating material, at least a part of said insulating material comprising a porous ceramic material, wherein a fluid is introduced through said porous ceramic material to control the temperature of said cathode electrode and/or that of said conductor portion.

21 Claims, 17 Drawing Sheets

F I G. 6
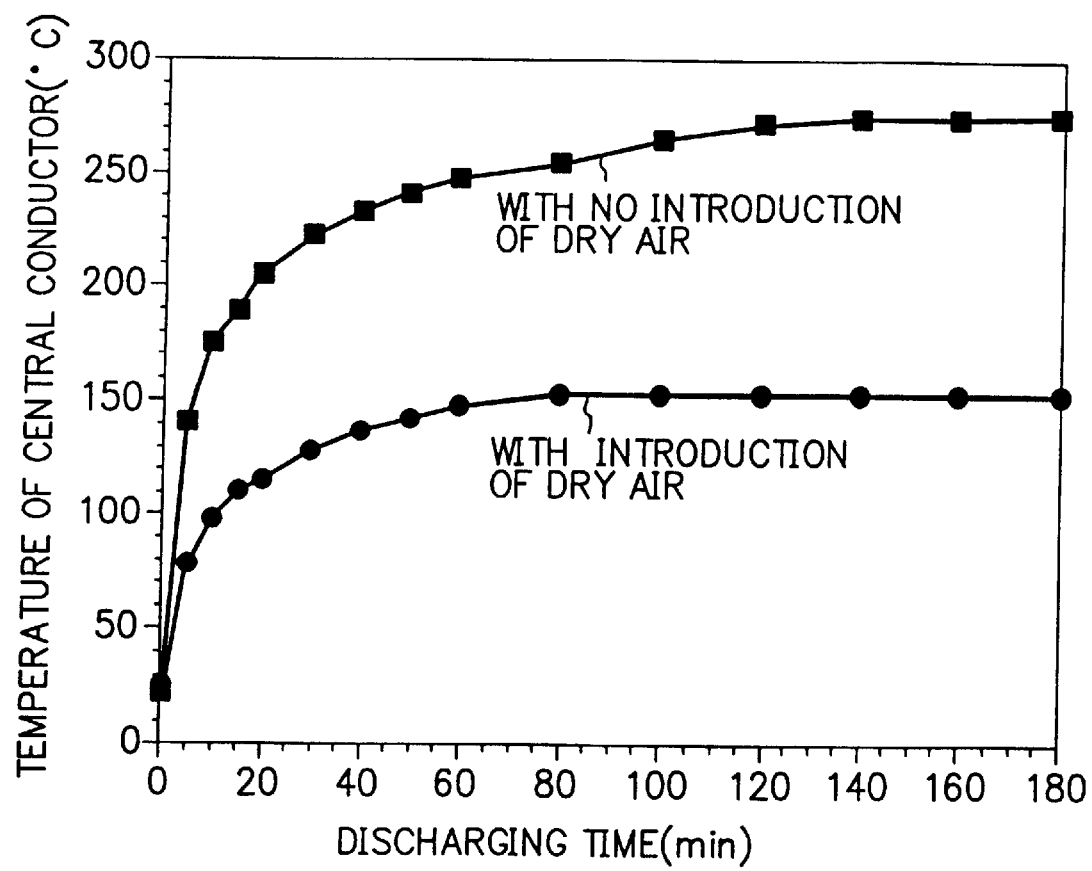

F I G. 9
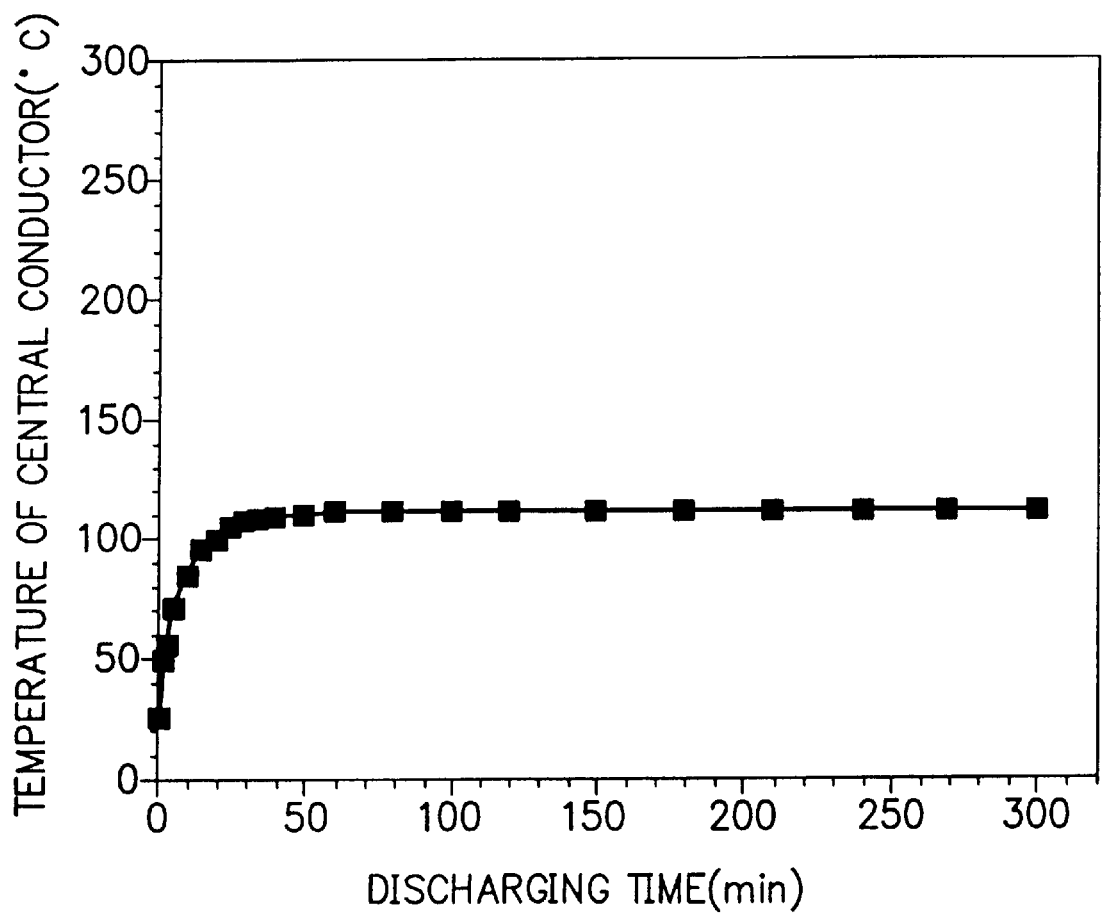

PLASMA PROCESSING APPARATUS AND METHOD

BACKGROUND OF THE INVENTION

1. Field of the Invention

The present invention relates a plasma processing apparatus and method for forming a deposited film, particularly, a functional deposed film on a desired substrate. The functional deposed film includes amorphous semiconductor films suitable for use in the amorphous semiconductor devices such as electrophotographic light receiving members (or electrophotographic photosensitive members), image input line sensors, image pickup devices, photovoltaic devices (including solar cells), and the like.

2. Related Background Art

In the production of semiconductor devices in recent years, the so-called RF plasma CVD (high frequency plasma chemical deposition) has been frequently used. In the RF plasma CVD, there is generally used an oscillation frequency of 13.56 MHz in view of the radio regulation law. The RF plasma CVD has advantages such that the control of discharging conditions is relatively easy and a deposited film obtain has an excellent film property, but it has disadvantages such that the utilization efficiency of film-forming raw material gas is not sufficient and the deposition rate (that is, the film-forming speed) of a deposited film formed is relatively low.

There has been proposed so-called microwave plasma CVD (hereinafter referred to as MW plasma CVD) using an oscillation frequency of 2.45 GHz. The MW plasma CVD has advantages which cannot be achieved by the RF plasma CVD, such that the utilization efficiency of film-forming raw material gas is extremely high and a deposited film can be formed at an extremely high deposition rate. An experiment of such MW plasma CVD is disclosed in, for instance, Japanese Unexamined Patent Publication No. 186849/1985. Particularly, this document discloses a MW plasma CVD for film formation using a MW plasma CVD apparatus. Document 1 describes that according to this MW plasma CVD, it is possible to form a deposited film on the surface of a cylindrical substrate at a high deposition rate while effectively utilizing film-forming raw material gas at a high utilization efficiency. However, for such MW plasma CVD as described in document, there are disadvantages such that because of using a microwave energy, the density of a plasma generated upon the film formation is extremely high and therefore, film-forming raw material gas is rapidly decomposed, wherefore it is difficult to establish desired film-forming conditions capable of forming a dense deposited film.

To order to eliminate such disadvantages in the film formation by the MW plasma CVD, Japanese Unexamined Patent Publication No. 273047/1995 proposes a film-forming apparatus using an oscillation frequency of a VHF (very high frequency) range (this oscillation frequency will be hereinafter referred to as oscillation frequency).

FIG. 1 is a schematic diagram illustrating the constitution of an experiment of such film-forming apparatus using an oscillation frequency of a VHF range. In the film-forming apparatus shown in FIG. 1 comprises a reaction chamber 100 (or a deposition chamber) in which six substrate holders 105A each having a cylindrical substrate 106 positioned thereon are spacedly arranged on the same circumference so as to establish a plasma generation region circumscribed by the six cylindrical substrates 106. Reference numeral 105B indicates an auxiliary substrate-retaining member. Each substrate holder 105A is provided with a heater 140 installed therein so as to heat the cylindrical substrate 106 from the inside. Each substrate holder 105A is held on a rotary shaft 131 connected to a driving motor 132 so that it can be rotated.

The reaction chamber 100 is provided with a cathode electrode 203 for the introduction of a high frequency power into the reaction chamber 100. The cathode electrode 203 is positioned at a center of the above described plasma generation region (or at a substantial center of the circle formed by the six cylindrical substrates arranged on the same circumference). The cathode electrode 203 is electrically connected to a high frequency power source 111 through a matching circuit 209. Each of reference numerals 600A, 600B, 601A and 601B indicates an earth shield, reference numeral 107 an exhaust pipe provided with an exhaust valve and which is connected to an exhaustion mechanism having a vacuum pump, and reference numeral 116 a gas feed pipe which is connected to a raw material gas supply system 108 through a gas supply pipe 117. Reference numeral 133 indicates a vacuum-sealing member.

This second document describes that the film-forming apparatus shown in FIG. 1 in which the cylindrical substrates 106 are spacedly arranged on the same circumference and the cathode electrode 203 is arranged at a center of the space circumscribed by the cylindrical substrates is of the structure capable of attaining a high raw material gas utilization efficiency and enables formation of a high quality deposited film having a uniform thickness and a homogeneous film property on each cylindrical substrate at a high deposition rate.

Incidentally, in recent years, there have been developed various high performance instruments in which amorphous silicon (a-Si) devices (amorphous silicon device will be hereinafter referred to as a a-Si device) are used. Along with this, there is an increased demand for such a-Si devices to be more improved in terms of the quality. For instance, in the field of electrophotography, there is an increased demand for providing a high performance electrophotographic apparatus which is inexpensive, can be installed in a small space at an office, and can reproduce a highly precise image which excels in quality at a good reproduction speed. In order to satisfy this demand, it is necessary for an a-Si device (that is, an a-Si light receiving member) used in the electrophotographic apparatus to be improved.

In view of this, the present inventors conducted various studies through experiments of the conventional film-forming apparatus and methods for forming an amorphous silicon device. As a result, it was found that heat generation of the film-forming apparatus during the film formation greatly influences the operation rate and stability of the apparatus and also the quality of a deposited film formed. For instance, for the film-forming apparatus shown in FIG. 1, it was found that temperature rising due to the heat generation at the cathode electrode for introducing a high frequency power into the reaction chamber and that at an introduction portion of the cathode electrode into the reaction chamber become problematic depending upon the conditions involved.

Such temperature increase due to heat generation is liable to entail such problems as will be described, in the formation of a deposited film.

(1). The film-forming apparatus suffers from mechanical damage. Particularly, in the case of the film-forming apparatus shown in FIG. 1, the electrical isolation of the cathode electrode from the reaction chamber, an insulating member constituted by an insulating resin material such as Teflon (trademark name) or the like or a ceramic material such as alumina ceramic, boron nitride or the like is used. However, when film formation is conducted under conditions which will cause significant temperature increase at the cathode electrode or the introduction portion of the cathode electrode into the reaction chamber, there is a fear that the insulating member constituted by the insulating resin material will be melted or burned. Even an insulating member constituted by ceramic material, is liable to suffer from distortion due to thermal expansion or damage due to thermal shock. When such problems occur, there is a fear that film-forming raw material gas leaks, and when the film-forming raw material gas comprises a spontaneously flammable gas such as $SiH_4$, such flammable gas is fired, where it is necessary to suspend the film-forming process.

(2). Spherical growth defects are liable to occur during the formation of a deposited film. Particularly, even in the case where the insulating member is not damaged as will be described in the above, when the temperature of the cathode electrode is significantly raised, the stress of a film deposited on the surface of the cathode electrode during the film formation is gradually increased as the temperature of the cathode electrode is raised, where the film deposited on the surface of the cathode electrode is sometimes peeled off.

It is known that when such film-peeling occurrs during the film formation, the peeled film generates particles, which deposit on the surface of a deposited film formed on a substrate, where abnormal film growth based on nucleuses comprising such film particles occurs to provide spherical growth defects in the deposited film formed on the substrate.

In the case where such spherical growth defects occur in the surface region of an a-Si deposited film, when an a-Si device as an electrophotographic light receiving member is prepared using such amorphous silicon deposited film, the electrophotographic light receiving member is liable to entail problems such that a minute white spot appears on an image reproduced, or a minute black dot appears on an image reproduced in the case of reverse development.

For an electrophotographic apparatus having a markedly improved performance in recent years, when the electrophotographic light receiving member used therein comprises an a-Si electrophotographic light receiving member (an a-Si device) containing a spherical defect which could be disregarded in the past, the spherical defect sometimes appears in the form of a minute white spot on an image reproduced. In this connection, it is necessary for the a-Si device to be improved in terms of the quality.

From the background as above described, an appropriate temperature-controlling mechanism is necessary to be provided for the introduction of a high frequency power and for the structure of the cathode electrode in the film-forming apparatus shown in FIG. 1. But the prior art is absolutely silent about this.

SUMMARY OF THE INVENTION

A principal object of the present invention is to eliminate the foregoing problems in the prior art and to provide a plasma processing apparatus and method in which a high frequency power introduction means for introducing a high frequency power into a reaction chamber, said high frequency power introduction means comprising a cathode electrode and a conductor portion for transmitting a high frequency power to said cathode electrode, by effectively cooling said cathode electrode and/or said conductor portion to prevent said plasma processing apparatus from suffering from mechanical damage while preventing occurrence of abnormal discharge, wherein plasma processing including film formation for an object can be stably conducted.

Another object of the present invention is to a plasma processing apparatus and method in which by effectively controlling a cathode electrode, a film deposited on the surface of said cathode electrode is prevented from being peeled off during the formation of a deposited film on a substrate, and a high quality amorphous silicon (a-Si) device can be formed.

A further object of the present invention is to provide a plasma processing apparatus and method in which by effectively cooling a cathode electrode and/or a conductor portion of transmitting a high frequency power to said cathode electrode, a high quality electrophotographic light receiving member can be stably formed.

A further object of the present invention is to provide a plasma processing apparatus comprising a reaction chamber capable of being evacuated, provided with at least a substrate holding means, a raw material gas introduction means for introducing a raw material gas into said reaction chamber and a high frequency power introduction means for introducing a high frequency power into said reaction chamber in which said raw material gas is decomposed by said high frequency power to form a deposited film on a substrate held by said substrate holding means, wherein aid high frequency power introduction means comprises a cathode electrode and a conductor portion capable of transmitting a high frequency power to said cathode electrode, said conductor portion being penetrated by a circumferential wall of said reaction chamber while said conductor portion is electrically isolated from said circumferential wall by means of an insulating material, at least a part of said insulating material comprising a porous ceramic material, wherein a fluid is introduced through said porous ceramic material to control the temperature of said cathode electrode and/or the temperature of said conductor portion.

A further object of the present invention is to provide a plasma processing method comprising the steps of introducing a raw material gas into a reaction chamber capable of being evacuated, and introducing a high frequency power into said reaction chamber by means of a high frequency power introduction means to decompose said raw material gas introduced into said reaction chamber, whereby a substrate arranged in said reaction chamber is subjected to plasma processing, wherein said high frequency power introduction means comprises a cathode electrode and a conductor portion capable of transmitting a high frequency power to said cathode electrode, said conductor portion penetrating a circumferential wall of said reaction chamber while said conductor portion being electrically isolated from said circumferential wall by means of an insulating material, at least a part of said insulating material comprising a porous ceramic material, wherein a fluid is introduced through said porous ceramic material to control the temperature of said cathode electrode and/or the temperature of said conductor portion.

BRIEF DESCRIPTION OF THE DRAWINGS

FIGS. 4, 6, 7, 9 and 10 are graphs respectively for explaining temperature changes of a central conductor in relation to lapse of discharging time.

DESCRIPTION OF THE INVENTION AND PREFERRED EMBODIMENTS

Figure 1:
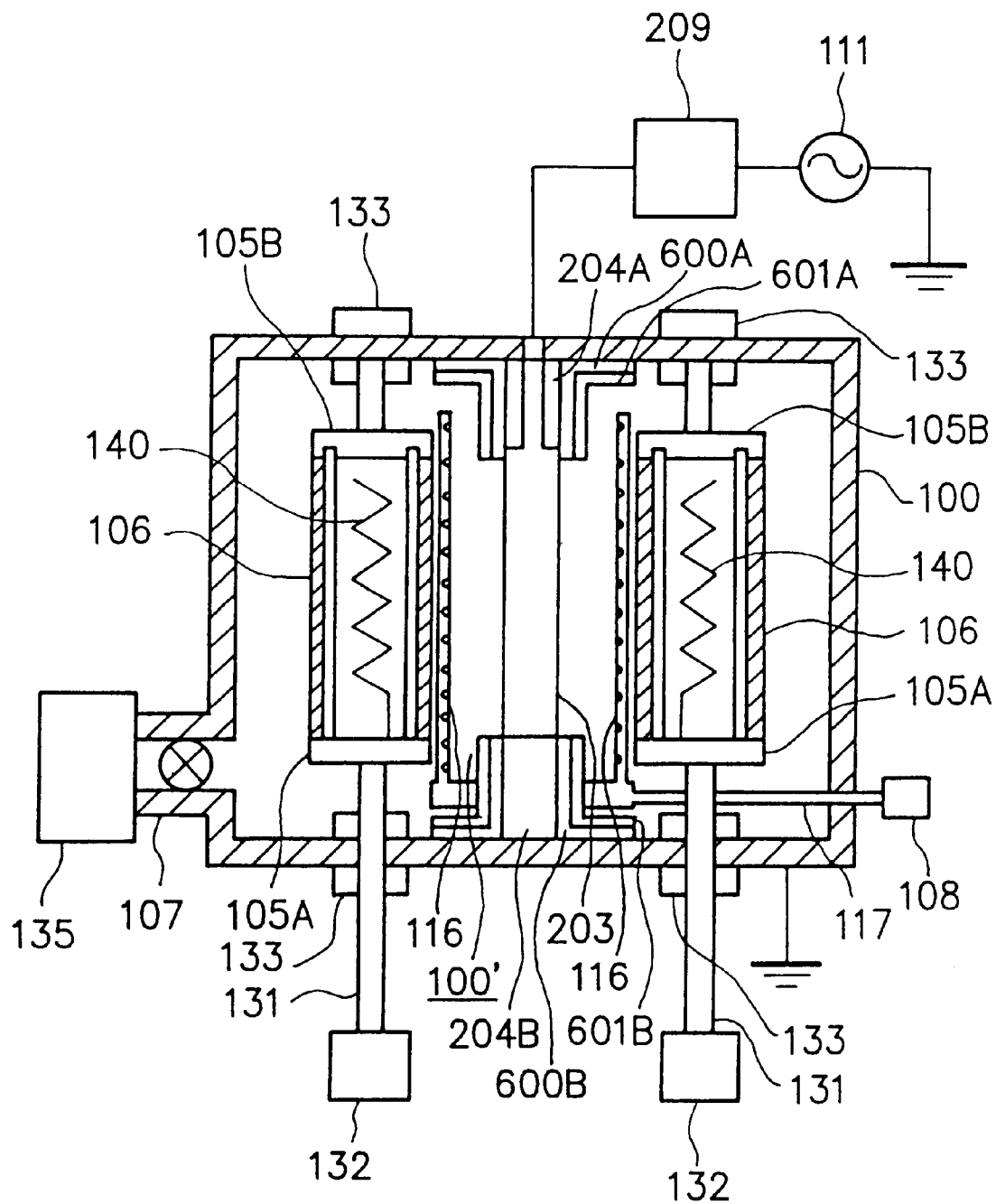
FIG. 1 is a schematic diagram illustrating an example of a film-forming apparatus as a plasma processing apparatus.

The present invention attains the foregoing objects. The present invention provides a plasma processing apparatus and a plasma processing method.

As previously described, a typical embodiment of the plasma processing apparatus according to the present invention comprises a reaction chamber capable of being evacuated, provided with at least a substrate holding means, a raw material gas introduction means for introducing a raw material gas into said reaction chamber and a high frequency power introduction means for introducing a high frequency power into said reaction chamber in which said raw material gas is decomposed by said high frequency power to form a deposited film on a substrate held by said substrate holding means, wherein said high frequency power introduction means comprises a cathode electrode and a conductor portion capable of transmitting a high frequency power to said cathode electrode, said conductor portion penetrating a wall of said reaction chamber while said conductor portion is electrically isolated from said wall of the reaction chamber by means of an insulating material, at least a part of said insulating material comprising a porous ceramic material, wherein a fluid is introduced through said porous ceramic material to control the temperature of said cathode electrode and/or the temperature of said conductor portion.

A typical embodiment of the plasma processing method according to the present invention comprises the steps of introducing a raw material gas into a reaction chamber capable of being evacuated, and introducing a high frequency power into said reaction chamber by means of a high frequency power introduction means to decompose said raw material gas introduced into said reaction chamber, whereby a substrate arranged in said reaction chamber is subjected to plasma processing, wherein said high frequency power introduction means comprises a cathode electrode and a conductor portion capable of transmitting a high frequency power to said cathode electrode, said conductor portion penetrating a circumferential wall of said reaction chamber while said conductor portion is electrically isolated from said circumferential wall by means of an insulating material, at least a part of said insulating material comprising a porous ceramic material, wherein a fluid is introduced through said porous ceramic material to control the temperature of said cathode electrode and/or the temperature of said conductor portion.

As the high frequency power used in the present invention, it is desired to use a high frequency power with an oscillation frequency in the range of 20 MHz to 450 MHz.

For the porous ceramic material in the present invention, it has an apparent porosity preferably in the range of 50% to 90%.

According to the present invention, the high frequency power introduction means, that is, the cathode electrode to substantially radiate a high frequency power into the reaction chamber and/or the conductor portion to transmit a high frequency power can be effectively controlled as desired with respect to their temperature so as to prevent the temperature of the high frequency power introduction means from being raised, whereby the plasma processing apparatus is effectively prevented from suffering from mechanical damage. This situation desirably improves the operation rate of the plasma processing apparatus and also desirably improved the stability of the plasma processing apparatus as a fabrication apparatus. In addition, the problems found in the prior art such that the inside atmosphere of the reaction chamber leaks, and raw material gas leaks and burned due to the mechanical damage of the plasma processing apparatus are effectively prevented from occurring.

Further, according to the present invention, by adjusting the temperature of the cathode electrode to a desired temperature, a film deposited on the surface of the cathode electrode can be effectively prevented from being peeled off during the formation of a deposited film on a substrate.

Hence, the plasma processing apparatus and method according to the present invention enable to stably and continuously form a high quality deposited film. This situation enables preparation of an extremely high quality a-Si electrophotographic light receiving member which always reproduce a high quality image substantially free of a defect comprising a minute white spot.

In the following, description will be made of particulars which made the present invention accomplished, on the basis of experiments conducted by the present inventors.

Experiment 1

Figure 2:
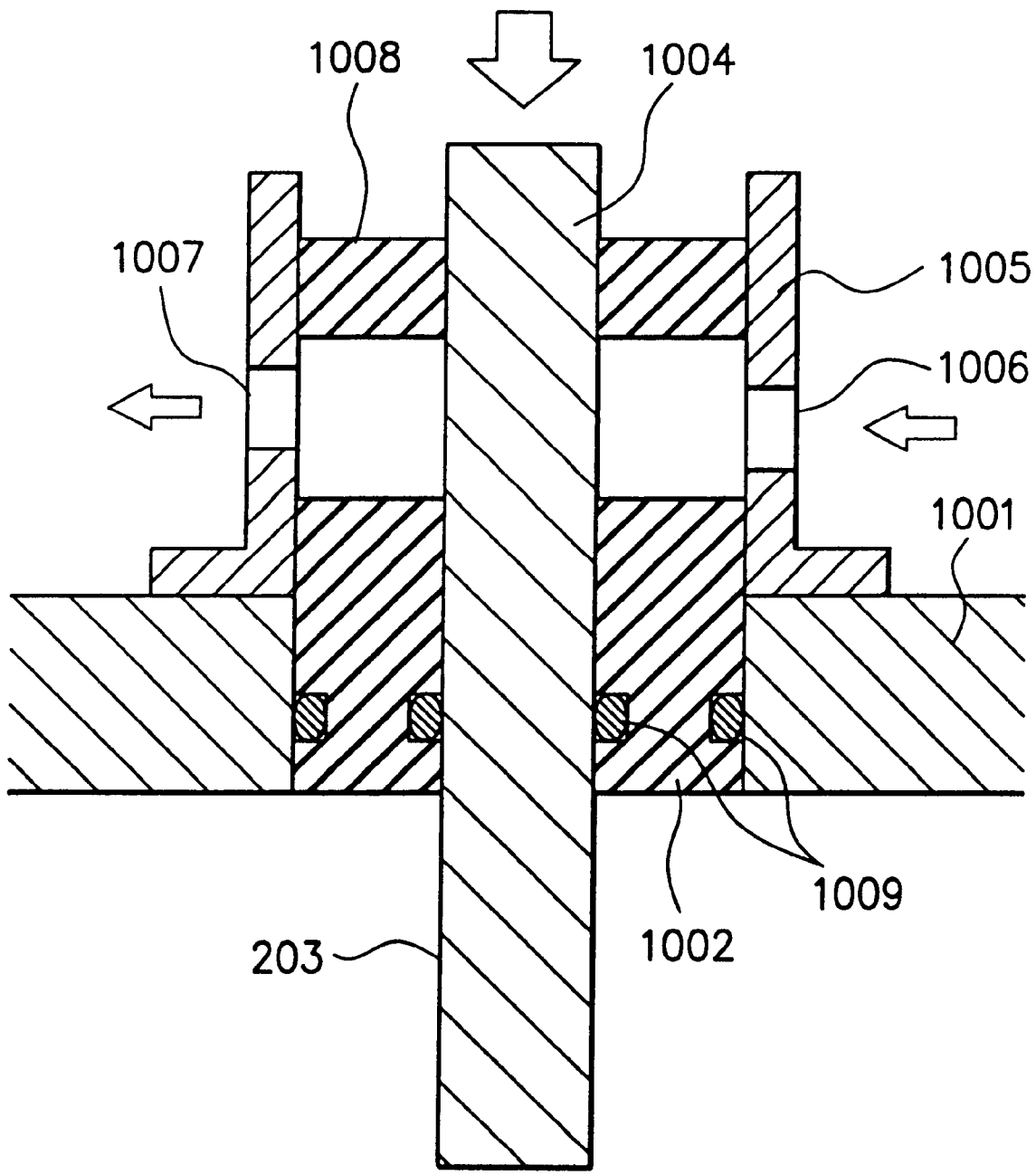
FIGS. 2, 5 (5A, 5B), 8 and 13 are schematic cross-sectional views respectively for explaining an example of a temperature controlling mechanism (including a cooling mechanism) for a central conductor in the present invention.

FIG. 2 is a cross-sectional view of a high frequency power introduction means used in this experiment. The high frequency power introduction means has a conductor for transmitting a high frequency power (this conductor will be hereinafter referred to as central conductor) and is provided with a mechanism for cooling said central conductor.

Particularly, the high frequency power introduction means shown in FIG. 2 comprises a cathode electrode 203 which is situated in a reaction chamber (not shown) and substantially radiates a high frequency power into said reaction chamber and a central conductor 1004 which penetrates a wall 1001 of said reaction chamber. About the central conductor 1004, there are provided an insulating member 1002 and an insulating member 1008 in order to electrically isolate the central conductor 1004 from an outer conductor 1005 and the reaction chamber's wall 1001. In FIG. 2, the cathode electrode 203 and the central conductor 1004 are divisionally shown in terms of their functions, but in practice, they may comprise an integral structure. Alternatively, they may be designed into a body comprising two members which are united.

The outer conductor 1005 is electrically and mechanically connected with the reaction chamber's wall 1001, and it forms a coaxial structure together with the central conductor 1004 and the insulating members 1002 and 1008. The insulating member 1002 is provided with sealing members 1009 so as to hermetically seal the inside of the reaction chamber (not shown). The outer conductor 1005 is provided with a fluid inlet 1006 and a fluid outlet 1007.

Figure 3:
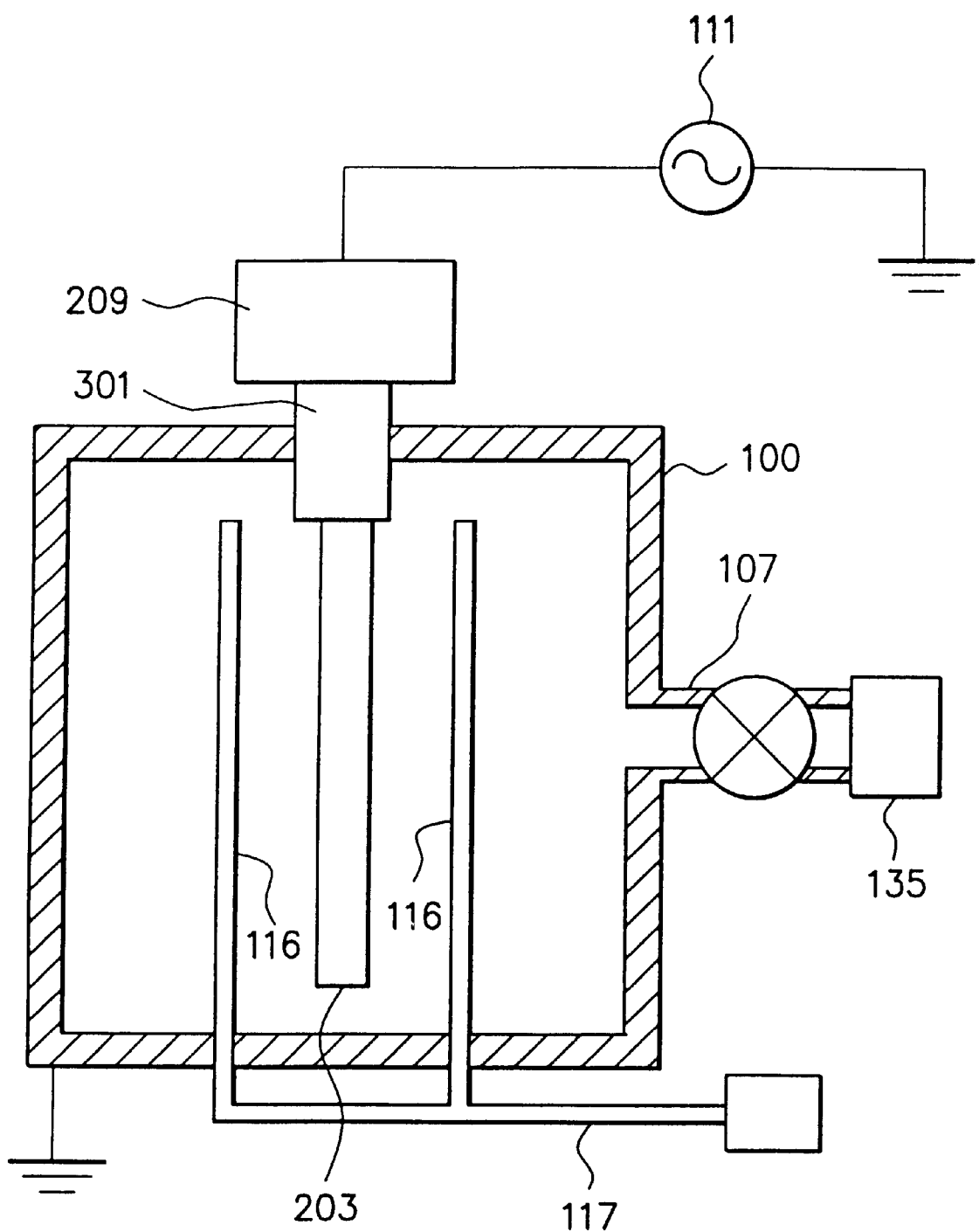
FIGS. 3 and 14 are schematic diagrams respectively illustrating an example of a plasma processing apparatus having a temperature controlling mechanism (including a cooling mechanism) for a central conductor in the present invention.

FIG. 3 is a schematic diagram illustrating a film-forming apparatus as a plasma processing apparatus used in this experiment. The apparatus shown in FIG. 3 comprises a reaction chamber 100 in which a cathode electrode 203 is arranged. The cathode electrode 203 penetrates a wall of the reaction chamber 100 through a high frequency power introduction portion 301 and is electrically connected to a high frequency power source 111 through a matching circuit 209.

The apparatus shown in FIG. 3 is provided with an exhaust pipe 107 which is connected to an exhaustion system 135 through an exhaust valve. Reference numeral 116 indicates a gas feed pipe which is connected a raw material supply system through a gas supply pipe 117. The gas feed pipe is provided with a plurality of gas ejection holes spacedly arranged in the longitudinal direction (not shown in the figure).

In this experiment, the high frequency power introduction means shown in FIG. 2 was installed in the film-forming apparatus, and film formation process was conducted in the following manner.

First, by actuating the exhaust system 135, the inside of the reaction chamber 100 was evacuated to a vacuum of less than 0.01 Pa. Then, $SiH_4$ gas was introduced into the reaction chamber 100 at a flow rate 300 sccm through the gas ejection holes (not shown) of the gas feed pipe 116, followed by adjusting the gas pressure in the reaction chamber to 1 Pa. After this, a high frequency power with an oscillation frequency of 105 MHz from the high frequency power source 111 was supplied to the cathode electrode 203 through the matching circuit 209. In this case, when glow discharge was once generated in the reaction chamber 100 by properly adjusting the matching circuit 209, glow discharging was conducted by adjusting the wattage of the high frequency power to 2500 W, where the matching circuit 209 was regulated so that the reflected wave from the cathode electrode 203 side was minimized. At this time, using an optical fiber temperature gage (produced by RACSTRON Company) positioned on the surface of the central conductor 1004 (see, FIG. 2) of the introduction portion 209, changes in the temperature of the central conductor were measured.

Separately, while introducing dry air of 25.3° C. through the fluid inlet 1006 (see, FIG. 2) at a flow rate of one liter per second (1 l/second), a film formation process was conducted in the same manner as in the above, where changes in the temperature of the central conductor 1004 were measured in the same manner as in the above.

Figure 4:
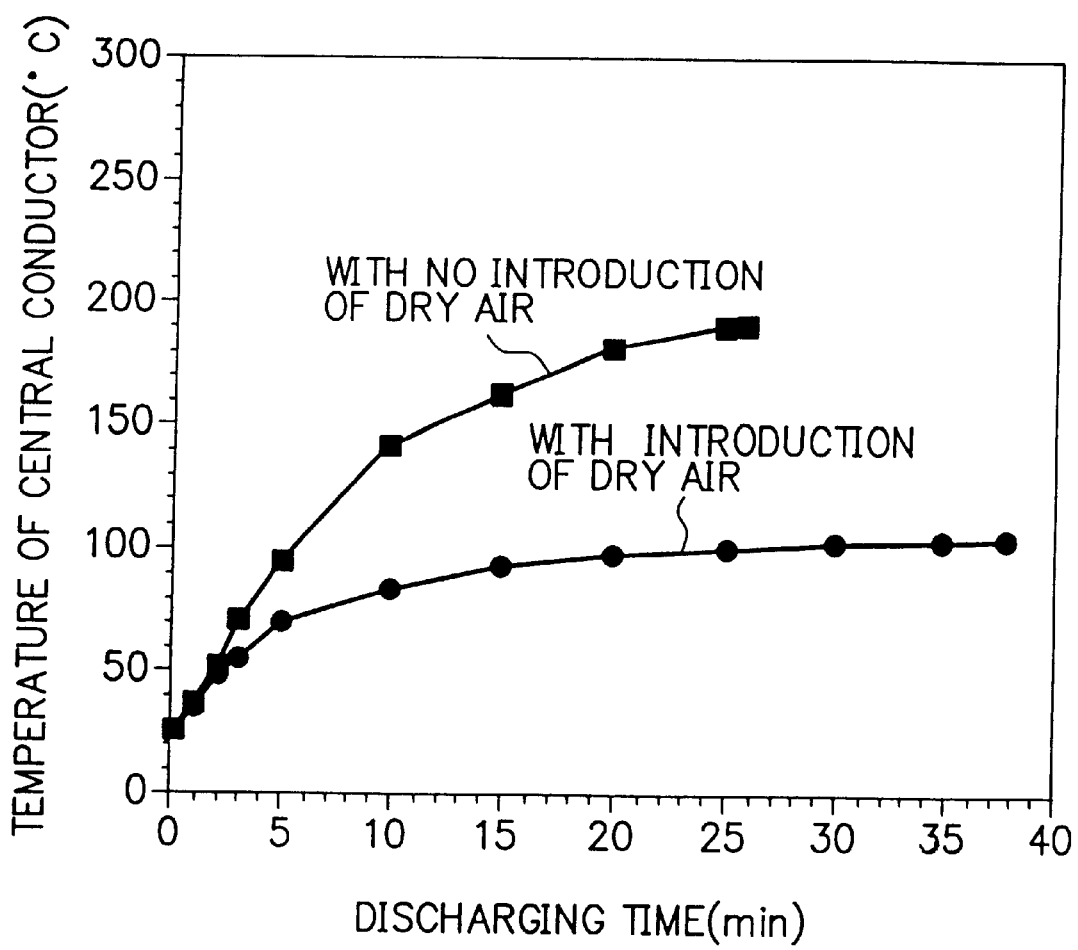

The measured results are graphically shown in FIG. 4. Based on the results shown in FIG. 4, there was obtained a finding that by introducing dry air through the fluid inlet 1006, the central conductor is cooled and is prevented from being raised with respect to the temperature thereof.

However, under the conditions in this experiment, the glow discharging became unstable and eventually terminated after 26 minutes since the commencement of the glow discharging in the case where no dry air was introduced and after 38 minutes since the commencement of the glow discharging in the case where dry air was introduced.

After the experiment, when the introduction portion 301 was disassembled, there was recognized a trace caused due to abnormal discharging not only at the surface of the central conductor 1004 but also at the inner face of the outer conductor 1005.

Based on the above results, there were obtained the following findings. That is, the introduction of dry air as above described is effective in controlling the temperature of the central conductor. But when a certain space is simply provided between the outer conductor and the central conductor as in the case of the apparatus shown in FIG. 2, abnormal discharging is liable to occur in such space.

Experiment 2

In view of the results obtained in Experiment 1, an improved high frequency power introduction means was used in this experiment.

Figure 5A:
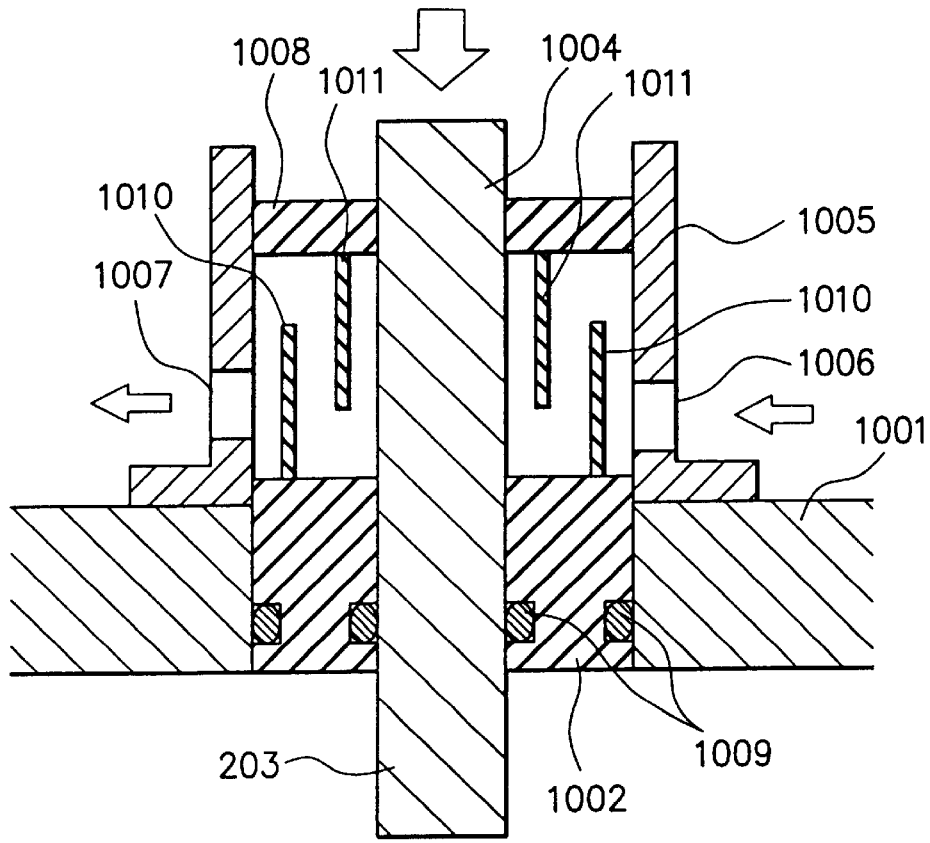
Figure 5B:
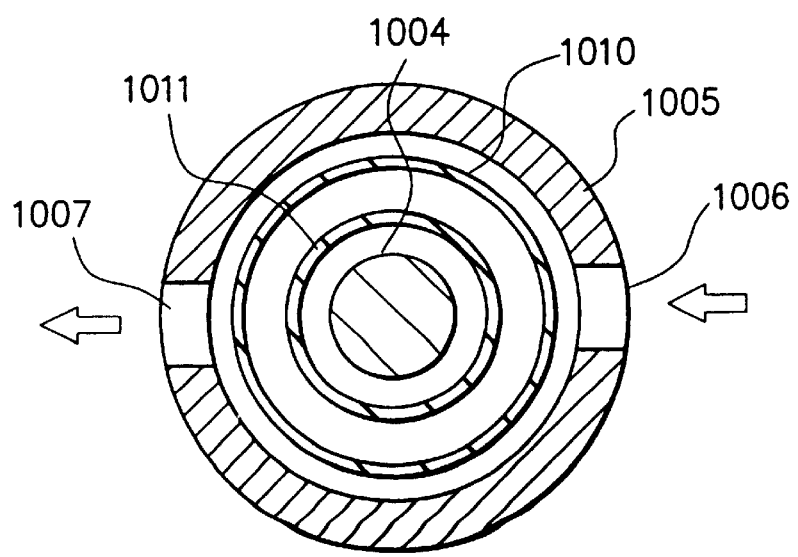

FIG. 5A is a schematic longitudinal section view of a high frequency power introduction means used in this experiment. FIG. 5B is a schematic cross-sectional view of the high frequency power introduction means shown in FIG. 5A. In the high frequency power introduction means shown in FIGS. 5A and 5B, in order to prevent abnormal discharging from occurring in the space between the central conductor and the outer conductor, cylindrical barrier walls 1010 and 1011 are arranged between the central conductor 1004 and the outer conductor 1005 such that they are concentric with the central conductor 1004. The cylindrical barrier walls 1010 and 1011 are designed to be shorter than the length of the space between the insulating members 1002 and 1008, and they are arranged such that they are deviated each other to upper and lower sides as shown in FIG. 5A.

In the high frequency power introduction means shown in FIGS. 5A and 5B, the fluid supplied through the fluid inlet 1006 flow such that it passes the upper portion of the barrier wall 1001 to come down, followed by passing the lower portion of the barrier wall 1011 to arrive at the central conductor 1004. In this configuration, the central conductor 1004 is not directly faced to the outer conductor 1005, and because of this, an effect of preventing abnormal discharging from occurring can be expected. Each of the barrier walls 1010 and 1011 herein is constituted by an insulating material.

In this experiment, the high frequency power introduction means shown in FIGS. 5A and 5B was installed in the apparatus shown in FIG. 3, and film formation process was conducted in the same manner as in Experiment 1, where changes in the temperature of the central conductor were measured in the same manner as in Experiment 1 of the case where no dry air was introduced and the case where dry air was introduced. The measured results are graphically shown in FIG. 6.

Based on the results shown in FIG. 6, it was found that the temperature rise of the central conductor in the case where no dry air is introduced is greater than that in Experiment 1. And there was obtained a finding that by introducing dry air, there is provided an effect of greater cooling the central conductor in comparison with the case where no dry air is introduced, but said cooling effect is somewhat inferior to that in Experiment 1. The reason for this situation, is considered to be that because the introduction portion (209, see FIG. 3) has a complicated structure, the impedance in the introduction portion is greatly varied to form a reflecting interface in terms of the transmission of a high frequency power, where the power transmission efficiency deteriorates to cause heat generation; and stagnation occurs in the flow of the dry air because of the presence of the two barrier walls.

Under the conditions in this experiment, there was not observed the occurrence of abnormal discharging.

Experiment 3

In this experiment, using the high frequency power introduction means used in Experiment 2, experiments of intermittently conducting the introduction of dry air were conducted in order to maintain the temperature of the central conductor 1004 in a predetermined region. In this experiment, the film formation process was conducted in the same manner as in Experiment 1, where a cycle of introducing dry air to cool the central conductor when the temperature of the central conductor goes beyond 190° C. and terminating the introduction of the dry air when the temperature of the central conductor is reduced to less than 170° C. was repeated, and changes in the temperature of the central conductor were measured in the same manner as in Experiment 1.

Figure 7:
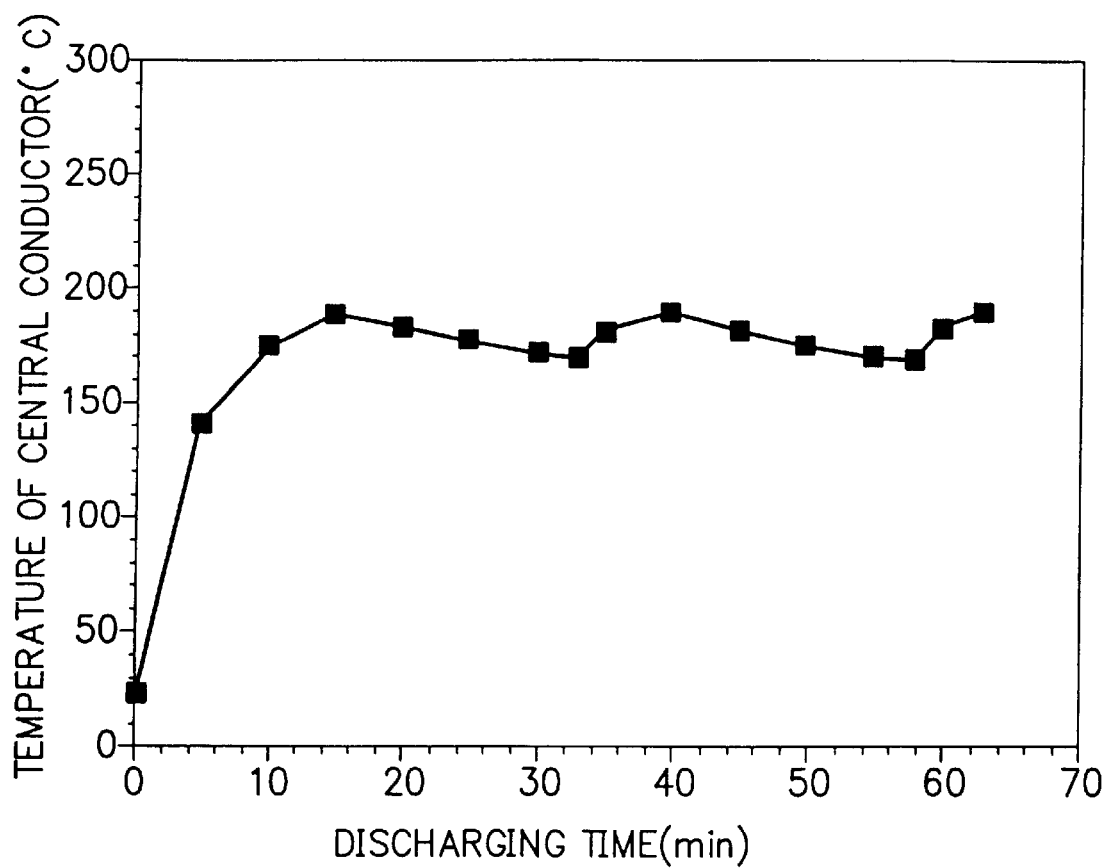

The measured results are graphically shown in FIG. 7. Based on the results shown in FIG. 7, it was found that in accordance with the manner employed in this experiment, the temperature of the central conductor can be maintained in a desired region. However, in this experiment, at about 63 minutes since the commencement of the discharging (that is, at a stage immediately after the third introduction of the dry air was conducted), abnormal discharging occurred at the high frequency power introduction portion, where the discharging was terminated. After the experiment, when the high frequency power introduction portion was disassembled, there was recognized a trace caused due to the abnormal discharging at a top portion of the barrier wall 1011 and also at the central conductor, and the barrier wall 1011 was found to have a damaged portion. The reason for this situation, is considered to be that a variation in the internal pressure upon the introduction of the dry air is chiefly involved.

Based on the above results, in the case of the structure of the high frequency power introduction portion shown in FIGS. 5A and 5B, it was found that to intermittently introduce the dry air is not suitable.

Experiment 4

Figure 8:
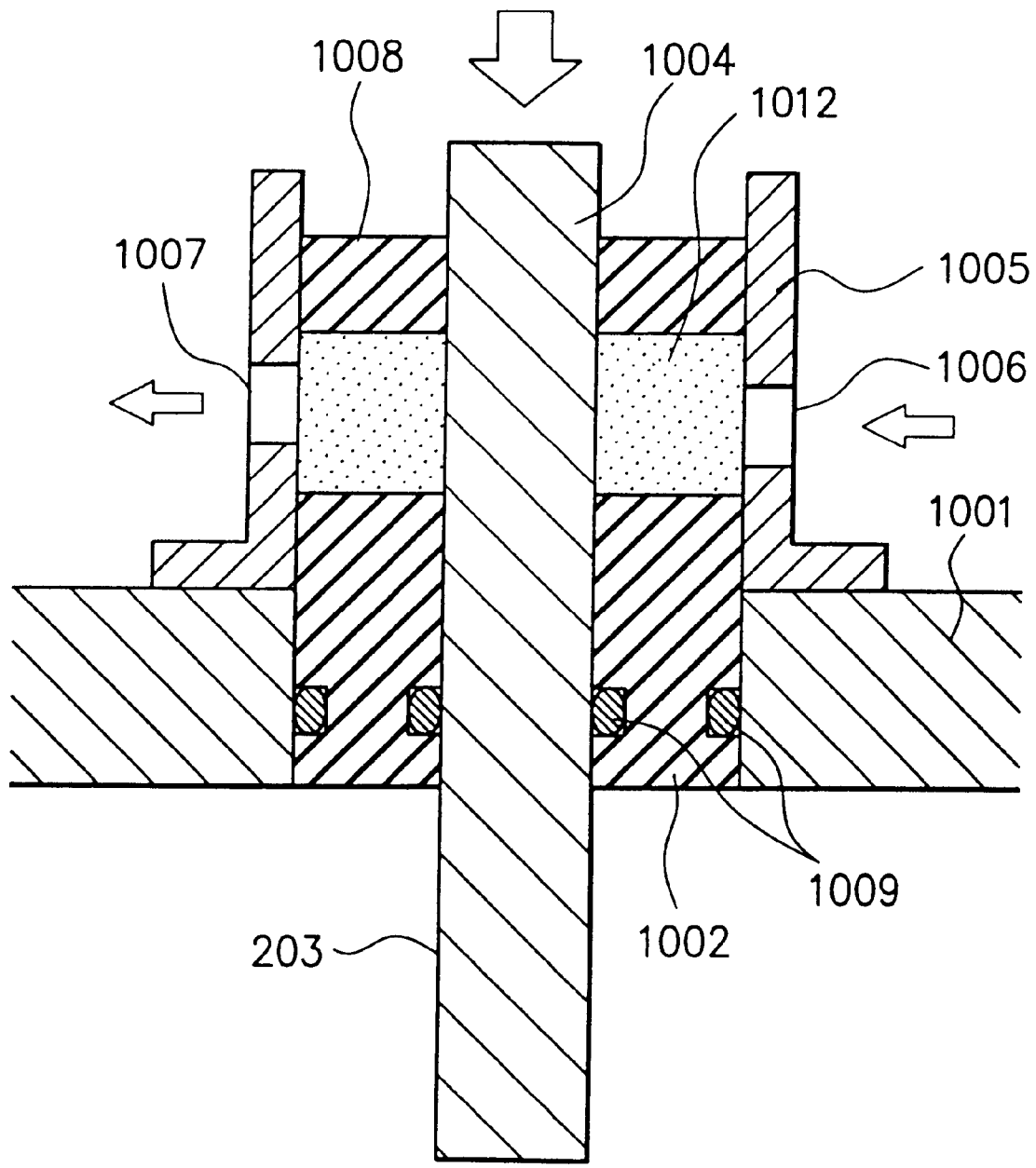

In view of the results obtained in Experiment 3, a high frequency power introduction means shown in FIG. 8 was installed in the apparatus shown in FIG. 3, and the film formation process was conducted in the same manner as in Experiment 1, where changes in the temperature of the central conductor only in the case where dry air was introduced were measured in the same manner as in Experiment 1.

The high frequency power introduction means shown in FIG. 8 is a partial modification of the high frequency power introduction means used in Experiment 1, wherein a porous ceramic material 1012 made of alumina ceramic is inserted in the space for the introduction of the dry air the high frequency power introduction means used in Experiment 1. As the porous ceramic material 1012, there was used a porous ceramic material made of alumina ceramic having a number of pores of about 1.5 mm in average diameter at an apparent porosity of about 80%.

The measured results obtained in the above are graphically shown in FIG. 9. In this experiment, the discharging was continued for 5 hours, and abnormal discharging as occurred in Experiments 1 to 3 never occurred. And in this experiment, there was provided a good effect of cooling the central conductor.

Experiment 5

In this experiment, using the apparatus used in Experiment 4, adjustment to maintain the temperature of the central conductor 1004 to be substantially constant was conducted by repeating a cycle of introducing dry air through the fluid inlet 1006 to cool the central conductor 1004 when the temperature of the central conductor goes beyond 190° C. and terminating the introduction of the dry air when the temperature of the central conductor is reduced to less than 170° C., where changes in the temperature of the central conductor were measured in the same manner as in Experiment 1. The measured results are graphically shown in FIG. 10.

In this experiment, the discharging was continued for 5 hours, and such abnormal discharging as occurred in Experiments 1 to 3 never occurred.

Figure 10:
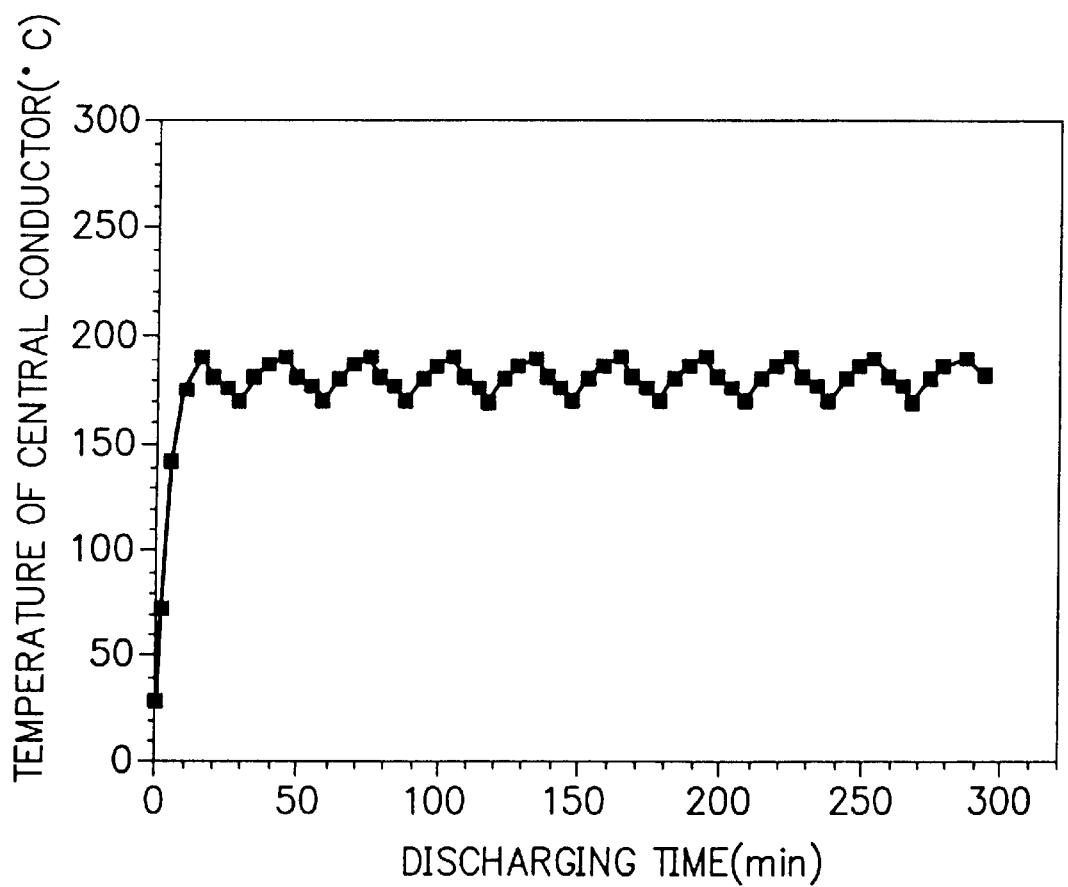

Based on the results shown in FIG. 10, it was found that by intermittently introducing the dry air, the temperature of the central conductor can be effectively controlled as desired.

In addition, based on the results obtained in Experiments 4 and 5, there was obtained a finding that by using a porous ceramic material at least as a part of the insulating member which electrically isolates between the central conductor and the reaction chamber, the temperature of the central conductor can be effectively controlled as desired, and abnormal discharging is effectively prevented from occurring in the high frequency power introduction portion.

Experiment 6

In this experiment, the apparatus used in Experiment 3 in which the high frequency power introduction means having the configuration shown in FIGS. 5A and 5B is installed and the apparatus used in Experiment 4 in which the high frequency power introduction means having the configuration shown in FIG. 8 is installed. For each apparatus, in order to measure the magnitude of a high frequency power practically supplied in the reaction chamber to cause glow discharging therein, a langmuir probe was inserted in the reaction chamber and the electron temperature of plasma generated was measured. In this experiment, the procedures of Experiment 1 were repeated, except that the flow rate of the $SiH_4$ was changed to 85 sccm and the oscillation frequency of the high frequency power was varied. In a provisional experiment which was conducted prior to conducting this experiment, for the apparatus of FIG. 3, there was obtained a finding that in the case where the flow rate of the $SiH_4$ is 85 sccm, under conditions. of 2500 W for the wattage of the high frequency power supplied, the high frequency power is in a complete flow limit region regardless of the oscillation frequency, and because of this, the magnitude of the wattage of the high frequency power supplied is possibly reflected to the electron temperature of plasma generated, as it is.

Figure 11:
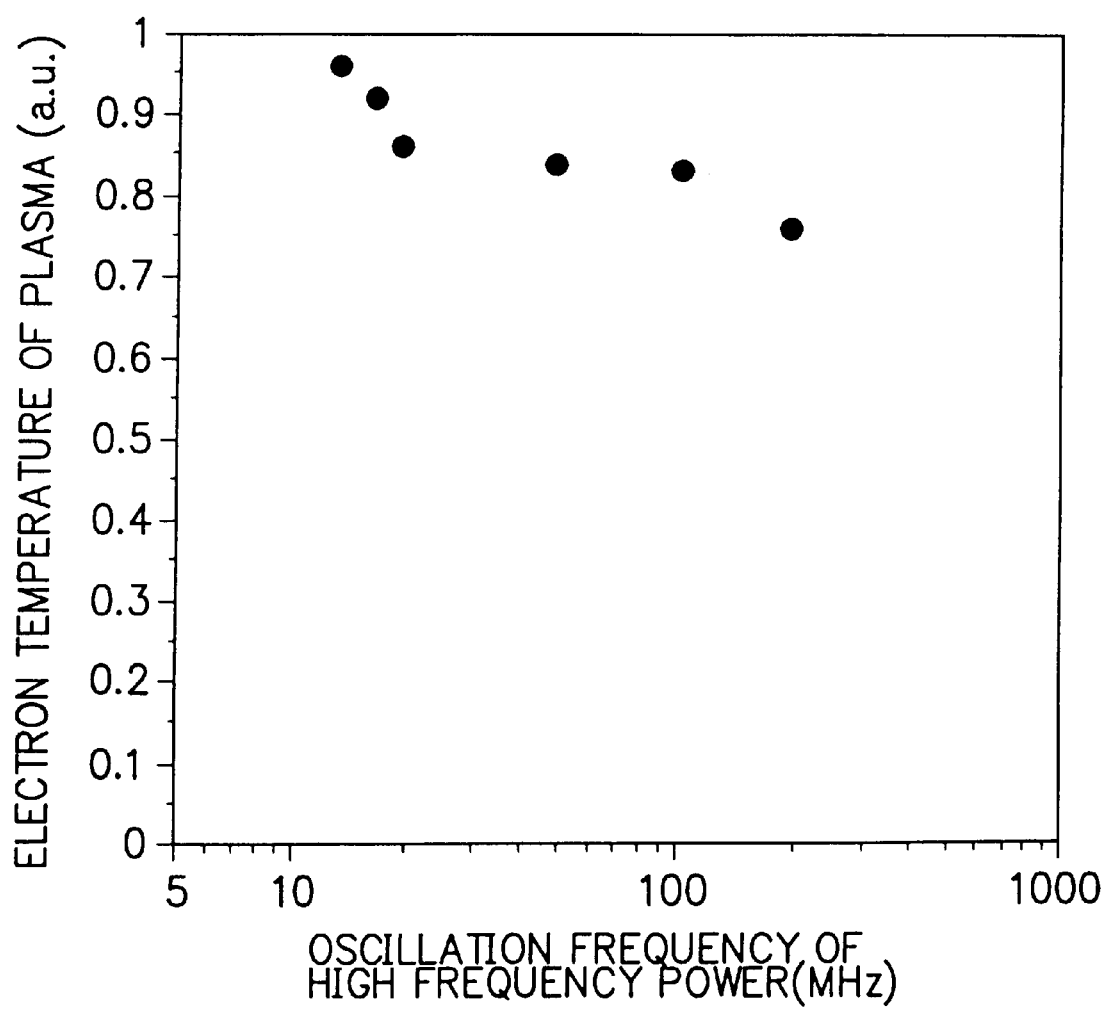
FIG. 11 is a graph for explaining apparatus dependency in terms of the relationship between the oscillation frequency of a high frequency power applied and the electron temperature of a plasma generated.

The measured results obtained in the above graphically shown in FIG. 11. In FIG. 11, because the situation for the high frequency power to be affected to the electron temperature is varied and the interdiscipline between the flow limit and the power limit is different depending on the oscillation frequency, the electron temperature value for each oscillation frequency in the case of the high frequency power introduction means shown in FIG. 8 is set at 1, and the electron temperature value for each oscillation frequency in the case of the high frequency power introduction means shown in FIGS. 5A and 5B is shown as a proportion to said value of 1.

From the results shown in FIG. 11, it is understood that the magnitude of the high frequency power practically introduced in the reaction chamber in the case of using the high frequency power introduction means shown in FIGS. 5A and 5B is smaller than that in the case of using the high frequency power introduction means shown in FIG. 8. And it is understood that the proportion between them becomes more significant as the oscillation frequency is increased. Further, in case of using the high frequency power introduction means shown in FIGS. 5A and 5B, when the oscillation frequency of the high frequency power supplied was made to be 200 MHz, after 18 minutes since the commencement of the discharging, the discharging was terminated because abnormal discharging occurred. And when the oscillation frequency of the high frequency power supplied was made to be more than 250 MHz, abnormal discharging frequently occurred from the initial stage, and because of this, the measurement of the electron temperature could not be conducted.

On the other hand, in case of using the high frequency power introduction means shown in FIG. 8, no abnormal discharging was observed. However, from the time when the oscillation frequency of the high frequency power supplied was made to be 500 MHz, the discharging became unstable and continous discharging could not be conducted.

Based on the above results, there were obtained the following findings. That is, when the oscillation frequency of the high frequency power supplied is more than 20 MHz, there is a significant difference in terms of the transmission efficiency between the case of using the high frequency power introduction means shown in FIGS. 5A and 5B and the case of using the high frequency power introduction means shown in FIG. 8. And when the oscillation frequency of the high frequency power supplied is beyond 450 MHz, even in the case of using the high frequency power introduction means shown in FIG. 8, desirable discharging is difficult to maintain.

Experiment 7

In this experiment, the high frequency power introduction means shown in FIG. 8 was installed in the apparatus shown in FIG. 3, and the apparent porosity of the porous ceramic material 1012 was varied, where the influence of each of given apparent porosities to the temperature of the central conductor 1004 was examined. In this experiment, under the same conditions as in Experiment 1, the optical fiber temperature gage was positioned on the surface of the central conductor 1004, changes in the temperature of the central conductor were measured only in the case where dry air was introduced at a flow rate of 1 1/second. In this case, the flow rate of the dry air was adjusted so as to be the same to each porous ceramic material having a number of pores of about 0.7 mm in average diameter and having a given apparent porosity by controlling the gas pressure. The comparison of the central conductor's temperatures was conducted for the central conductor's temperatures 10 minutes from the time when the temperature of the central conductor became 60° C. because the temperature of the central conductor at the time of commencing discharging was somewhat different in each experiment.

Figure 12:
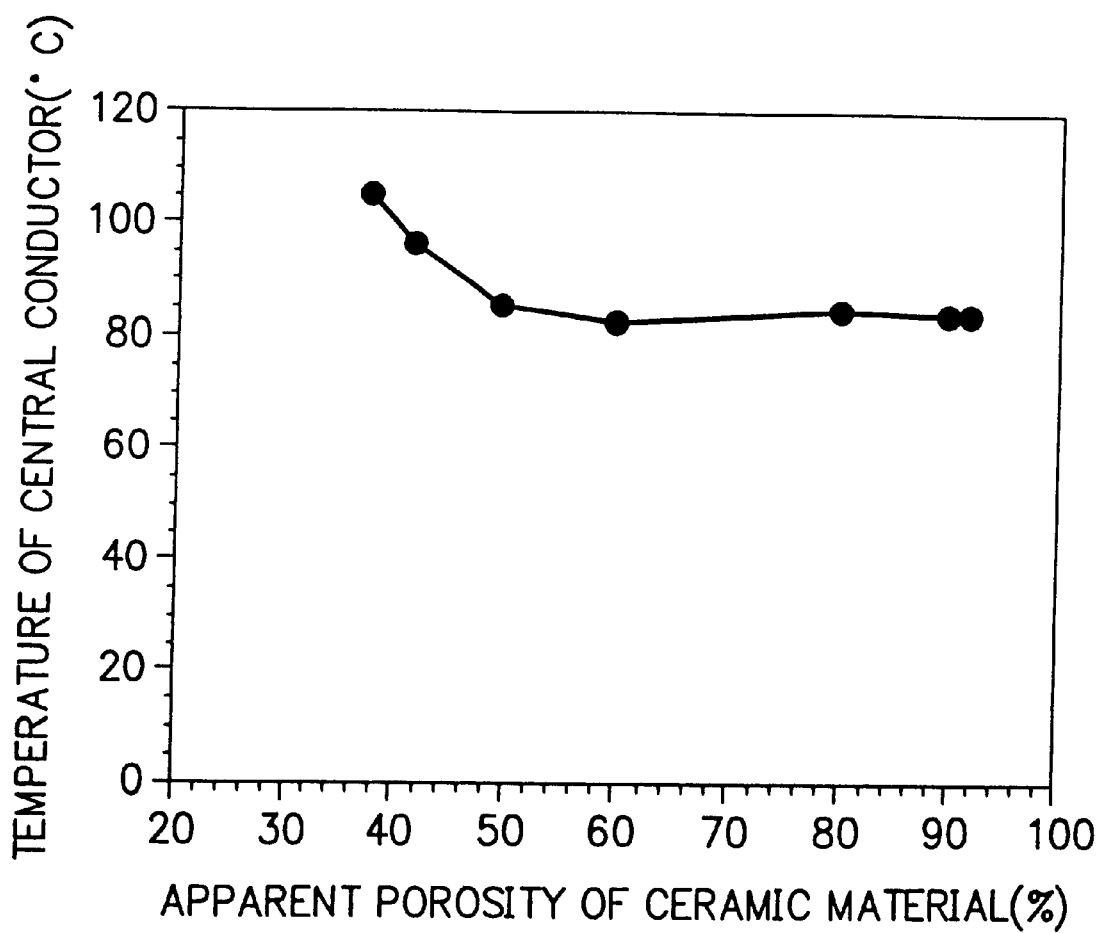
FIG. 12 is a graph for explaining the relationship between the apparent porosity of a ceramic material used in a temperature controlling mechanism and the temperature of a central conductor.

The measured results are graphically shown in FIG. 12.

Based on the results shown in FIG. 12, it is understood that each porous ceramic material is effective in cooling the central conductor. However, in the case where the apparent porosity is less than 50%, it is understood that the temperature of the central conductor is rapidly increased to the contrary of the case where the apparent porosity is more than 50%. The reason for this, is considered to be that when the apparent porosity is small, even if the dry air should be introduced at the same flow rate, the probability of the dry air to directly touch the central conductor would be decreased.

The present invention has been accomplished on the basis of the findings obtained in the above described experiments 1 to 8. A principal feature of the present invention is that in a plasma processing apparatus (or a plasma CVD apparatus) having a reaction chamber provided with at least a high frequency power introduction means installed therein, said high frequency power introduction means comprising a central conductor for transmitting a high frequency power, a cathode electrode and an outer conductor and having a structure to electrically isolate said central conductor from the circumferential wall of said reaction chamber by means of an insulating member, a porous ceramic material is used at least as a part of said insulating member and a fluid is introduced through said porous ceramic material, wherein the temperature of said central conductor or/and said cathode electrode can be effectively controlled as desired. Particularly, by establishing a fluid passage comprising said porous ceramic material for controlling the temperature of said central conductor or/and said cathode electrode, said central conductor is prevented from directly facing said outer conductor, the length of the discharging path between said central conductor and said outer conductor is markedly prolonged, and substantially no edge portion of the insulating member is formed. This situation enables effectively preventing abnormal discharging from occurring, as apparent from the results obtained in the above experiments 1 to 3. Further, in the present invention, it is possible to effectively prevent abnormal discharging from occurring by such relatively simple constitution as above described, and because of this, substantially no unnecessary reflecting interface of the high frequency power is formed and the transmission efficiency of the high frequency power is not deteriorated.

In addition, according to the constitution of the present invention, for instance, even in the case of such high frequency power introduction means as shown in FIG. 8, creeping discharging is effectively prevented from occurring at the interface between the insulating member 1002 and the porous ceramic material 1012. The reason for this is considered to be that the mutual contact of these materials is based on point contact and therefore, substantially no interface of causing the creeping discharge is formed; and the action of the interface as the reflecting interface is weak as above described.

Further, as will be understood from the results obtained in Experiment 5, even in the case where dry air is intermittently introduced into the high frequency power introduction portion during the plasma processing, according to the present invention, it is possible to effectively prevent abnormal discharging due to change of pressure from occurring. The reason for this is considered to be that the foregoing space is divided into a number of cells by the porous ceramic material and because of this, this structure in the space functions as resistance against rapid inflow of the fluid to relax the change of pressure, and the foregoing edge is not formed.

As is apparent from the above description, the present invention enables to effective control of the temperature central conductor and/or that of the cathode electrode as desired while effectively preventing abnormal discharging from occurring in the high frequency power introduction portion, where such advantages as above described are provided.

The porous ceramic material used in the present invention includes spongy ceramic materials having a three-dimensional network structure in which a number of pores are uniformly distributed.

Thus, the term porous of the porous ceramic material in the present invention means such a structure that a number of three-dimensional network structures are stacked so that the opposite side of the material cannot be sighted and a fluid can be freely penetrated among the network structures.

Hence, the porous ceramic material in the present invention does not include those ceramic materials having a number of enclosed pores which are not communicated with the surface and those ceramic materials having a number of pores linearly (two-dimensionally) distributed therein which are prepared by way of mechanical processing.

Specifically, as the porous ceramic material in the present invention, any porous ceramic materials can be used as long as they satisfy the conditions of the foregoing apparent porosity and average diameter for the pores. Specific preferable examples of the constituent of the porous ceramic material are ceramics such as alumina, zirconia, mullite, cordierite, silicon carbide, and boron nitride, and mixtures of two or more of these ceramics. Of these, alumina and boron nitride are particularly preferable in the viewpoints that they excel in insulation performance and also in transmittance of a high frequency power. The reason why these ceramics are used as the porous ceramic material in the present invention is that they excel in hardness and are difficult to deform even in the case where a high pressure fluid is introduced, and therefore, they are highly effective in preventing abnormal discharging from occurring.

There is no particular limitation for the apparent porosity of the porous ceramic material as long as a fluid is desirably penetrated. However, as will be understood from the results obtained in Experiment 7, when the apparent porosity is less than 50%, there is a tendency that the temperature controlling effect deteriorates. And when the apparent porosity is beyond 90%, there is a tendency that the mechanical strength is distinguishably decreased. In this connection, the porosity is desired to be in the range of 50% to 90%.

For the average diameter for the pores, it is not always a serious factor in order to attain the advantages of the present invention. However, in the case where the average diameter is excessively large, when the distance between the central conductor and the outer conductor is short, it is difficult to make the central conductor and the outer conductor such that one cannot sighted from the other, where to effectively prevent abnormal discharging from occurring will be sometimes difficult. On the other hand, in the case where the average diameter is excessively small, jam-packing or the like will be sometimes occurred depending upon the kind of a fluid used. In this respect, the average diameter for the pores should be properly decided depending upon the shape or size of the high frequency power introduction portion or/and the kind of a fluid used.

As the insulating member other than the porous ceramic material in the present invention, there can be used synthetic resins such as Teflon and polycarbonate; glasses such as quartz glass and pyrex glass; and those ceramics above mentioned. It is desired for the insulating member to be constituted by the same component of the porous ceramic material, in view of matching the impedance and also in view of preventing a problem due to a difference in the coefficient of thermal expansion from occurring.

As the fluid used for controlling the temperature of the cathode electrode and/or that of the central conductor in the present invention, there can be used gases such as air, nitrogen gas, Ar gas, and He gas; and liquids such as water and insulative oils. The present inventors conducted experiments using water and an insulative oil as the fluid introduced in the case where the high frequency power introduction means shown in FIG. 2 or FIGS. 5A and 5B. As a result, such abnormal discharging as described in Experiments 1 to 3 did not occur in any case. And even in the case where such liquid is used as the fluid, the impedance in the high frequency power introduction portion is desirably prevented from being varied, resulting in an improvement in the transmission efficiency of the high frequency power.

In the present invention, there is no particular restriction for the oscillation frequency of the high frequency power used for causing discharging (glow discharging). As previously described, the effect to prevent abnormal discharging from occurring and the effect to improve the transmission efficiency of the high frequency power are promoted as the oscillation frequency is increased. This tendency is particularly significant when the oscillation frequency is more than 20 MHz. However, when the oscillation frequency is beyond 450 MHz, it is difficult for the high frequency power to be uniformly radiated by the cathode electrode, and depending upon the related conditions, it is difficult to maintain the glow discharging in a desirable state. In this connection, the oscillation frequency is desired to be in the range of 20 MHz to 450 MHz.

In the present invention, if necessary, it is possible to simultaneously control the temperature of the central conductor and that of the cathode electrode.

Figure 13:
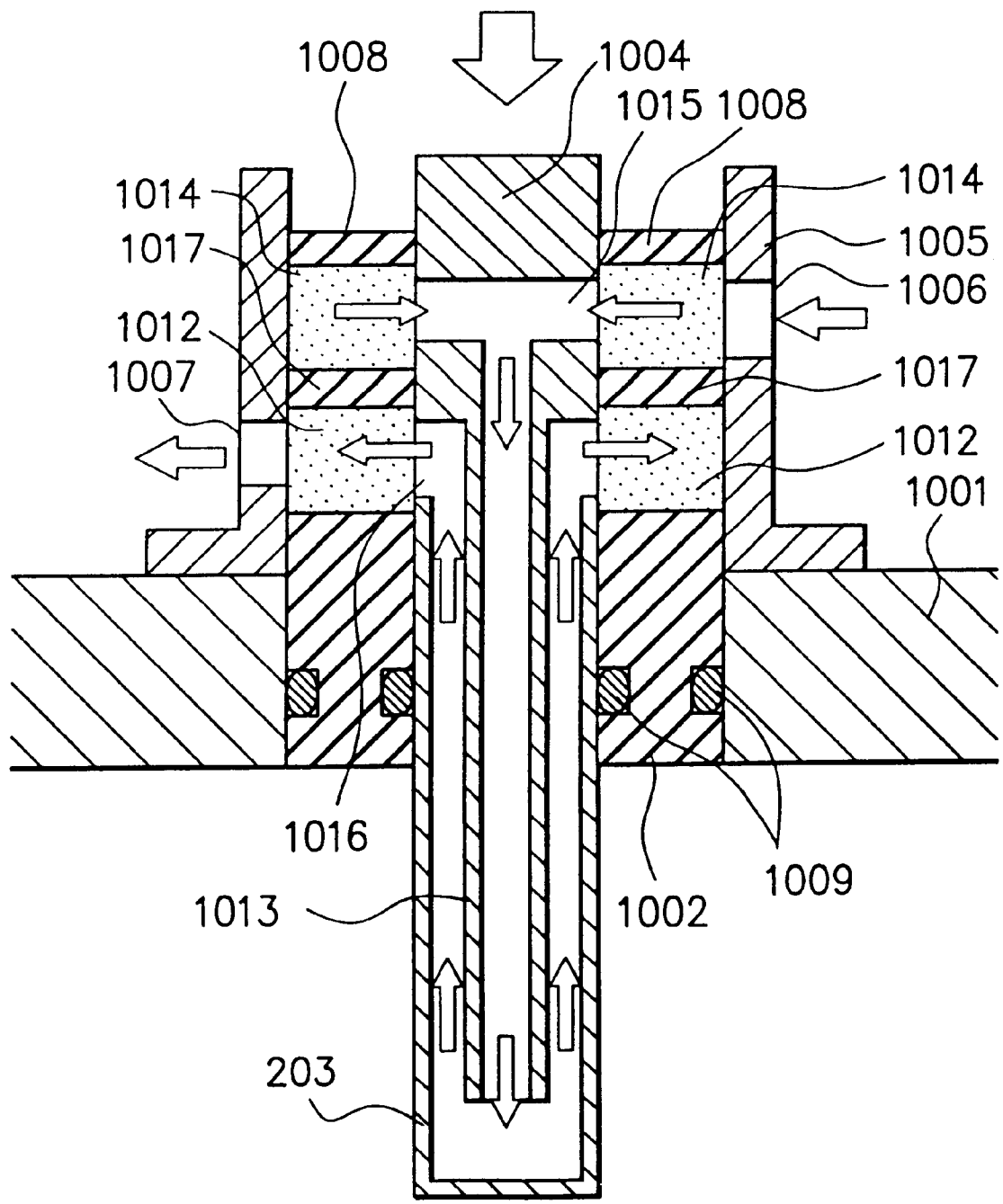

FIG. 13 is a schematic cross-sectional view illustrating an example of a high frequency power introduction means in which the temperature of the high frequency power introduction portion and that of the cathode electrode can be controlled as desired at the same time.

In FIG. 13, a cathode electrode 203 and a central conductor 1004 are double-structured, where a fluid introduced through a fluid inlet 1006 passes through a porous ceramic material 1014, followed by flowing into the central conductor 1004 through a hole 1015 (or a space) provided at the central conductor 1004. Then, the fluid passes a center pipe 1013 to enter into the cathode electrode 203, flows through a hole 1016 (or a space) provided at the central conductor 1004 to enter into a porous ceramic material 1012, followed by being discharged to the outside through a fluid outlet 1007. The fluid introduced is separated from that to be discharged by means of an insulator 1017.

In the case where the configuration shown in FIG. 13 is employed, the temperature control of the cathode electrode can be more effectively conducted. However, depending upon the discharging condition involved, when the temperature rise in the cathode electrode portion is small, there is an occasion that the effects of the present invention can be attained by controlling only the temperature of the central conductor. Therefore, the necessity of practically controlling also the temperature of the cathode electrode should be decided depending upon the conditions for forming a desired device or the apparatus conditions for forming said device.

The constituent of the cathode electrode and that of the central conductor may be any materials as long as they can transmit a high frequency power. Specific examples of such material are metals such as Al, Cr, Mo, Au, In, Ni, Ti, Pt, and Fe, and alloys of these metals.

Besides, insulating materials applied with electrically conductive treatment to their surface are also usable. The insulating material in this case can include alumina, zirconia, mullite, cordierite, silicon carbide, and boron nitride. The surface treatment may be conducted in a manner of coating a given insulating material with a given metal by means of plasma spraying, plating, or sputtering.

In order for a film deposited on the surface of the cathode electrode to be prevented from being peeled off during the plasma processing (or the film formation), the surface of the cathode electrode may be roughened. In order to form such roughened surface, blast processing of spraying a given projecting material at high pressure is suitable.

The surface roughness is desired to be in the range of 5 to 200 μm in terms of Rz (10 points-average roughness in which the sampling length is 2.5 mm).

In the present invention, a cover may be provided on the surface of the cathode electrode for the purposes of preventing film-peeling and improving the corrosion resistance of the cathode electrode. In this case, the cover is also cooled through the cathode electrode, and therefore, the effects of the present invention can be attained. When the cover is provided on the surface of the cathode electrode, at least an exterior surface thereof (which is contacted with plasma in the reaction chamber) may be roughened to have a surface roughness in the range of 5 to 200 μm in terms of Rz.

The temperature adjustment or the temperature control in the present invention means that by introducing a given fluid, the temperature of the cathode electrode and/or that of the central conductor are changed versus the case where no fluid is introduced. Therefore, to decrease the temperature of the central conductor by simply introducing the dry air as described in Experiment 4 and to control the flow rate of the fluid so as to be in a prescribed range while measuring the temperature as described in Experiment 5 are included in the present invention. Further, in addition to the case where the cathode electrode and/or the central conductor are cooled as described in Experiments 1 to 7, the case of heating the cathode electrode and/or the central conductor by introducing a given fluid which has been headed in advance is included in the present invention. For instance, in this case, by introducing said fluid heated in advance through the fluid inlet, the cathode electrode and/or the central conductor can be heated.

In the following, description will be made of embodiments of film formation in accordance with the present invention.

Figure 14:
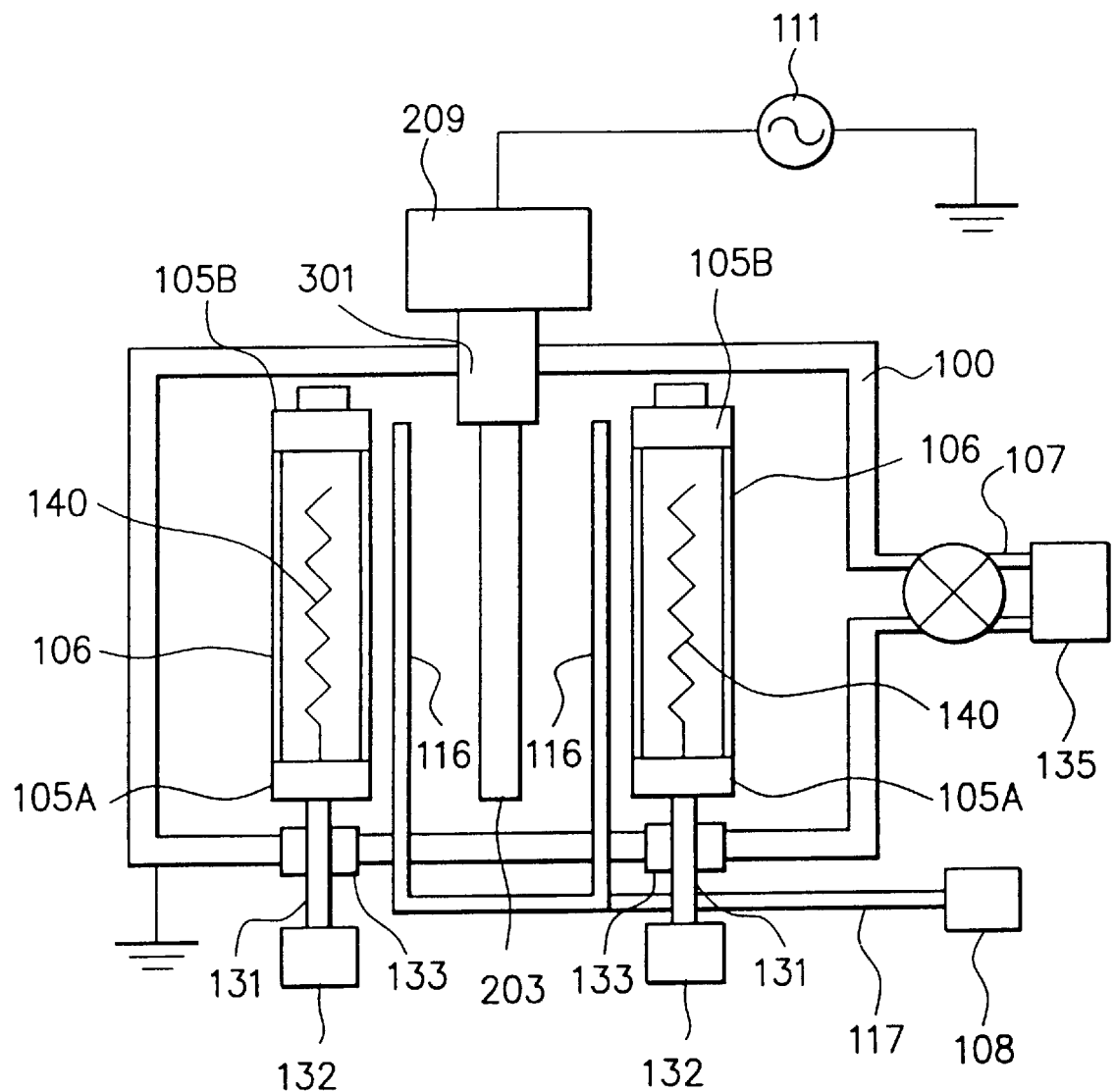

FIG. 14 is a schematic diagram illustrating the constitution of an example of a plasma CVD film-forming apparatus. The apparatus shown in FIG. 14 comprising a reaction chamber 100 capable of being evacuated in which cylindrical substrates 106 are arranged. In the figure, only two cylindrical substrates are shown, but in practice, six cylindrical substrates are arranged. Particularly, the six cylindrical substrates 106 are spacedly arranged on the same circumference. Each cylindrical substrate 106 is positioned on one of six substrate holders 105A each a heater 140 installed therein. Reference numeral 105B indicates an auxiliary substrate-retaining member. Each substrate holder 105A is held on a rotary shaft 131 connected to a driving motor 132 so that it can be rotated.

At a substantial center of the circle formed by the six cylindrical substrates 106 spacedly arranged on the same circumference, there is provided a high frequency power introduction means of the present invention comprising a cathode electrode 203 and a high frequency power introduction portion 301. The cathode electrode 203 penetrates the circumferential wall of the reaction chamber 100 at the introduction portion 301 and is electrically connected to a high frequency power source 111 through a matching circuit 209.

The reaction chamber 100 is provided with an exhaust pipe 107 provided with an exhaust valve and which is connected to an exhaustion mechanism having a vacuum pump (not shown). Reference numeral 116 indicates a gas feed pipe which is connected to a raw material gas supply system 108 through a gas supply pipe 117. Reference numeral 133 indicates a vacuum-sealing member.

Figure 15:
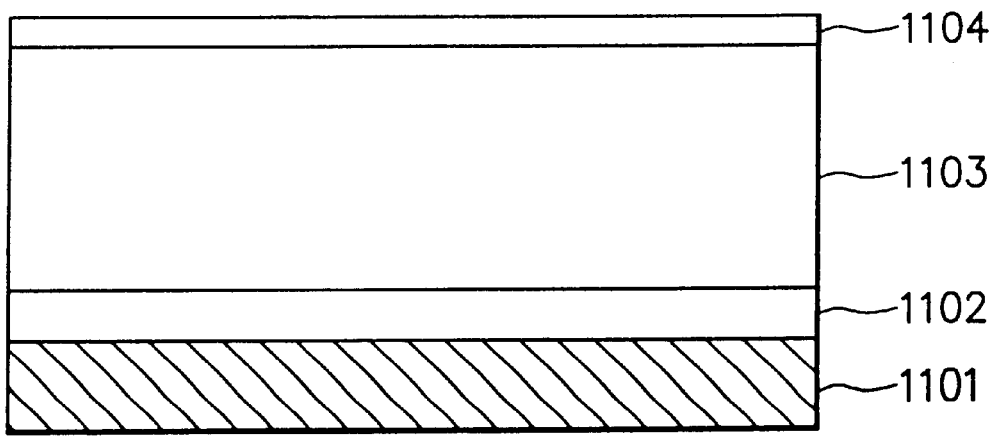
FIG. 15 is a schematic cross-sectional view of the configuration of an example of an electrophotographic light receiving member prepared in the present invention.

Using the apparatus shown in FIG. 14, in order to form, for instance, an electrophotographic light receiving member having a multi-layered light receiving layer comprising a charge injection inhibition layer 1102, a photoconductive layer 1103 and a surface layer 1104 stacked in this order on a substrate 1101 as shown in FIG. 15, the formation of the electrophotgraphic light receiving member is conducted, for example, in the following manner.

There are provided six well-cleaned cylindrical substrates 106 made of, for example, stainless steel. Each substrate is positioned on one of the substrate holders 105A. The inside of the reaction chamber 100 is evacuated to a vacuum of less than 0.01 Pa by actuating the exhaustion system 135. Then, inert gas such as Ar gas from the gas supply system 108 is supplied through the gas supply pipe 117 and it is introduced into the reaction chamber 100 at a desired flow rate through the gas feed pipe 116. While observing a pressure gage (not shown), the gas pressure in the reaction chamber 100 is adjusted to a desired pressure by regulating the exhaust valve provided at the exhaust pipe 107. Each substrate is heated to and maintained at a desired temperature in the range of 20 to 500° C. by actuating the heater 140. When the temperature of each substrate becomes constant at said desired temperature, the introduction of the inert gas is terminated.

Then, from the gas supply system 108, raw material gas for the formation of the charge injection inhibition layer is supplied through the gas supply pipe 117 and is introduced into the reaction chamber 100 through the gas feed pipe 116. While observing the pressure gage, the gas pressure in the reaction chamber 100 is adjusted to a desired pressure by regulating the exhaust valve provided at the exhaust pipe 107. When the gas pressure becomes stable at said desired pressure, the high frequency power source 111 is switched on to introduce a high frequency power with a desired oscillation frequency and having a desired wattage through the matching circuit 209 and the high frequency power introduction means, where glow discharging is caused to decompose the raw material gas, whereby causing the formation of a deposited film as the charge injection inhibition layer on each substrate 106. At this time, simultaneously with the introduction of the high frequency power from the high frequency power source 111 or when the temperature of the central conductor 1004 reached a prescribed temperature, through the fluid inlet 1006, dry air is introduced to control the temperature of the central conductor 1004 as desired. Alternatively, if necessary, as previously described, it is possible to introduce dry air heated in advance through the fluid inlet 1006 whereby heating the central conductor 1004 prior to commencing the glow discharging.

During the film formation by way of the glow discharging, by rotating each substrate through the rotary shaft 131 which is rotated by means of the driving mechanism 132, a deposited film having a uniform thickness over the entire surface of the substrate can be formed. By this, a desirable charge injection inhibition layer having a desired thickness can be formed on each substrate.

When the formation of the charge injection inhibition layer is completed, the introduction of the high frequency power and the raw material gas is terminated, where the glow discharging is eventually terminated. After this, the inside of the reaction chamber is again evacuated to a vacuum of less than 0.01 Pa. Then, the above film-forming procedures are repeated, except for using desired raw material gas suitable for the formation of the photoconductive layer in order to form the photoconductive layer and using desired raw material gas suitable for the formation of the surface layer in order to form the surface layer, whereby the photoconductive layer and the surface layer are sequentially formed. Thus, there can be obtained a desirable electrophotographic light receiving member.

In the present invention, the substrate used for film formation may be either electrically conductive or electrically insulative.

The electrically conductive substrate can include, for example, metals such as Al, Cr, Mo, Au, In, Nb, Te, V, Ti, Pt, Pd, and Fe; and alloys of these metals such as stainless steels.

The electrically insulative substrate can include, for example, films or sheets of synthetic resins such as polyester, polyethylene, polycarbonate, cellulose acetate, polypropylene, polyvinyl chloride, polystyrene and polyamide, glass or ceramics. Any of these films or sheets is desired to be applied with electroconductive treatment to at least a surface thereof on which a deposited film is to be formed. In this case, the remaining surface may be also applied with electroconductive treatment.

The substrate may be of any configuration such as cylindrical, plate-like or belt-like shape having a smooth or irregular surface.

In order to form a deposited film comprising an amorphous silicon (a-Si) material such as a-Si:H (this deposited film will be hereinafter referred to as amorphous silicon deposited film), an appropriate gaseous or easily gasifiable raw material capable of supplying Si is used. Specific examples of such raw material are $SiH_4$, $Si_2H_6$, $Si_3H_8$, and $Si_4H_{10}$. Of these, $SiH_4$ and $Si_2H_6$ are particularly preferable in view of the easy film forming work and the good efficiency for the supply of Si. These Si-supplying compounds may used either singly or in combination with two or more of them.

Besides, gaseous or gasifiable fluorine-containing silicon compounds, namely, fluorine-substituted silane derivatives such as $SiF_4$ and $Si_2F_6$, and gaseous or gasifiable fluorine-substituted silicon hydrides such as $SiH_3F$, $SiH_2F_2$ and $SiHF_3$, are also usable as the Si-supplying raw material. These Si-supplying compounds may be used either singly or in combination with two or more of them.

If necessary, any of the above mentioned Si-supplying raw materials may be diluted with an appropriate gas such as $H_2$ gas, Ar gas, He gas or Ne gas.

The amorphous silicon deposited film may contain a dopant comprising atoms of a conductivity controlling element belonging to group IIIb of the periodic table which provide a p-type conductivity (this atom will be hereinafter referred to as group IIIb atom) or atoms of a conductivity controlling element belonging group Vb of the periodic table which provide an n-type conductivity (this atom will be hereinafter referred to as group Vb atom).

In order for the amorphous silicon deposited film to contain such dopant, an appropriate raw material capable of supplying group IIIb or Vb atoms is used in addition to the foregoing Si-supplying raw material.

Such group IIIb or Vb atoms-supplying raw material can include raw materials capable of supplying group IIIb or Vb atoms, which are in the gaseous state at room temperature or can be easily gasified at least under the conditions for the formation of the deposited film.

Such group IIIb atoms-supplying gaseous or gasifiable raw material can include boron hydrides such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$, and $BBr_3$. Besides $AlCl_3$, $GaCl_3$, $Ga(CH_3)_3$, $InCl_3$, and $TlCl_3$ are also usable.

Such group Vb atoms-supplying gaseous or gasifiable raw material can include phosphorous hydrides such as $PH_3$ and $P_2H_4$; and phosphorous halides such as $PH_4I$, $PF_3$, $PF_5$, $PCl_3$, $PCl_5$, $PBr_3$, $PBr_5$ and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable.

Any of these group IIIb or Vb atoms-supplying raw materials may be diluted with an appropriate gas such as $H_2$ gas, Ar gas, He gas or the like, if necessary.

Separately, if necessary, the amorphous silicon (a-Si) deposited film may contain at least one kind of atom selected from carbon atoms (C), oxygen atoms (O), and nitrogen atoms (N) [hereinafter referred to as atoms (C,O,N)].

In order for the amorphous silicon deposited film to contain atoms (C,O,N), an appropriate gaseous or gasifiable raw material capable of supplying atoms (C,O,N) is used in addition to the foregoing Si-supplying raw material.

As such raw material capable of supplying C (carbon atoms) which is used in the formation of, for instance, an amorphous silicon carbide (a-SiC) deposited film, there can be mentioned, for example, gaseous or gasifiable hydrocarbons such as $CH_4$, $C_2H_6$, $C_3H_8$, and $C_4H_{10}$. These C-supplying compounds may be used either singly or in combination with two or more of them. If necessary, these C-supplying raw materials may be diluted with an appropriate gas such as $H_2$ gas, Ar gas, He gas, or the like.

As such raw material capable of supplying O (oxygen atoms) which is used in the formation of, for instance, an amorphous silicon oxide (a-SiO) deposited film, there can be mentioned, for example, $O_2$, $O_3$, $CO_2$, and the like. Besides, NO, $NO_2$, $N_2O$, $N_2O_3$, $N_2O_4$, $N_2O_5$, and $NO_3$, which are capable of supplying O (oxygen atoms) and N (nitrogen atoms) at the same time, are also usable. Other than these, compounds comprising silicon (Si), oxygen (O) and hydrogen (H) atoms such as lower siloxanes, e.g., $H_3SiOSiH_3$, $H_3SiOSiH_2OSiH_3$, and the like are also usable.

As such raw material capable of supplying N (nitrogen atoms) which is used in the formation of, for instance, an amorphous silicon nitride (a-SiN) deposited film, there can be mentioned, for example, $N_2$, $NH_3$, $HN_3$, $H_2NNH_2$, and the like. Besides, NO, $NO_2$, $N_2O$, $N_2O_3$, $N_2O_4$, $N_2O_5$, and $NO_3$, which are capable of supplying N (nitrogen atoms) and O (oxygen atoms) at the same time, He gas, Ar gas, of Ne gas are also usable.

In order to form an amorphous silicon (a-Si) deposited film having desired properties, the related film-forming conditions are properly adjusted depending upon the requirements involved.

For the discharging power (that is, the wattage of a high frequency power supplied), its optimum range should be determined in accordance with a previously established design for a layer formed and also the configuration of the apparatus used. However, in general, in order to attain a sufficient deposition rate and desired characteristics for a deposited film formed, it is desired to be in the range of 10 to 5000 W per one substrate.

For the gas pressure (the inner pressure) in the reaction chamber, its optimum range should be also determined in accordance with the related conditions involved as well as the discharging power. However, in general, it is desired to be in the range of 0.01 to 1000 Pa.

In the following, the features and advantages of the present invention will be described in more detail with reference to examples. It should be understood that these examples are only for illustrative purposes and not intended to restrict the scope of the present invention to these examples.

EXAMPLE 1

In this example, using the plasma processing apparatus (the film-forming apparatus) shown in FIG. 14 in which the high frequency power introduction means shown in FIG. 8 is installed and in accordance with the foregoing film-forming procedures with the use of the apparatus shown in 14, there were prepared six electrophotographic light receiving members of the configuration shown in FIG. 15 under conditions shown in Table 1.

In this example, dry air of 25.3° C. was continuously introduced into the high frequency power introduction portion of the high frequency power introduction means of FIG. 8 at a flow rate of 0.3 l/second, from the time when glow discharging was first generated. As the porous ceramic material in the high frequency power introduction means, there was used a porous alumina material having a number of pores of 1.2 mm in average diameter at an apparent porosity of 80%.

In this example, during the film formation, the temperature of the cathode electrode was measured by means of an optical fiber temperature gauge positioned at a tip portion of the cathode electrode.

In this example, the cathode electrode was made to have a blast-processed surface with a roughness of about 38 μm in terms of Rz.

Figure 16:
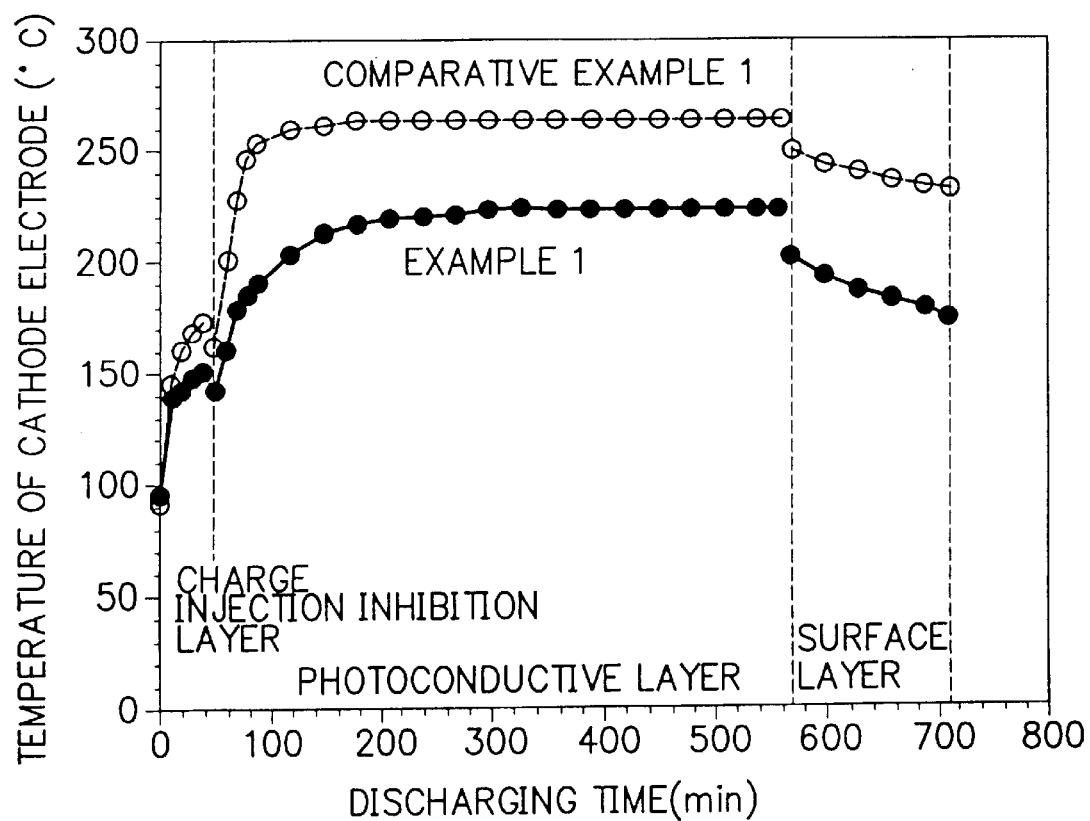
FIG. 16 is a graph showing temperature changes of cathode electrodes in relation to lapse of discharging time.

The measured results of the temperature of the cathode electrode are graphically shown in FIG. 16.

For the resultant electrophotographic light receiving members (the electrophotographic light receiving member will be hereinafter referred to as light receiving member), evaluation was conducted with respect to appearance of defective image comprising white spot(s), using a modification of a commercially available electrophotographic apparatus NP 6060 (produced by CANON Kabushiki Kaisha), modified for experimental purposes.

The above evaluation was conducted in the following manner.

Each light receiving member is set to the above electrophotographic apparatus, wherein without conducting image exposure, a whole black solid image (hereinafter referred to as solid image) is obtained. For the resultant solid image, the presence or absence of white spot(s) in the solid image is optically examined.

The examined result is shown in Table 2 on the following criteria.

⊚: a case wherein the quality of the image is excellent,
◯: a case wherein the quality of the image is good enough,
Δ: a case wherein the quality of the image not good but practically acceptable, and
X: a case wherein the image has distinguishable defects and practically unacceptable.

COMPARATIVE EXAMPLE 1

The procedures of Example 1 were repeated, except that no dry air was introduced into the high frequency power introduction portion, to obtain six electrophotographic light receiving members.

In this comparative example, the temperature of the cathode electrode during the film formation was measured in the same manner as in Example 1. The measured results are graphically shown in FIG. 16 as well as in Example 1.

For the resultant electrophotographic light receiving members, evaluation was conducted with respect to appearance of defective images comprising white spot(s) in the same manner as in Example 1.

The evaluated result is shown in Table 2 as well as in Example 1.

Based on the results shown in Table 2, the following fact is understood. That is, the present invention in which the porous ceramic material is used as a part of the high frequency power introduction portion of the high frequency power introduction means and the temperature of the central conductor is controlled through the porous ceramic material enables to produce a high quality electrophotographic member which provides a high quality image which is substantially free of the appearance of white spots. The reason for this, as will be understood with reference to the results shown in FIG. 16, is considered to be the fact that the temperature change of the cathode electrode at the initial stage of the glow discharging, particularly at the initial stage of forming the photoconductive layer in Example 1 is apparently smaller than that in Comparative Example 1. In other words, it is considered that the situation of Example 1 in which the cathode electrode was prevented from suffering from changes in the temperature by cooling the central conductor of the high frequency power introduction portion by the dry air would lead to diminishing appearances of white spots.

EXAMPLE 2

In this example, using the plasma processing apparatus (the film-forming apparatus) shown in FIG. 14 in which the high frequency power introduction means shown in FIG. 13 is installed and in accordance with the foregoing film-forming procedures with the use of the apparatus shown in 14, there were prepared six electrophotographic light receiving members of the configuration shown in FIG. 15 under conditions shown in Table 3.

In this example, dry air of 25.3° C. was continuously introduced into the high frequency power introduction portion of the high frequency power introduction means of FIG. 13 at a flow rate of 1 l/second, from the time when glow discharging was first generated. As the porous ceramic material in the high frequency power introduction means, there was used a porous boron nitride material having a number of pores of 1 mm in average diameter at an apparent porosity of 70%.

In this example, during the film formation, the temperature of the cathode electrode was not measured.

In this example, the cathode electrode was made to have a blast-processed surface with a roughness of about 15 μm in terms of Rz.

For the resultant electrophotographic light receiving members, evaluation was conducted with respect to appearance of defective image comprising white spot(s) in the same manner as in Example 1.

The evaluated result is shown in Table 4.

COMPARATIVE EXAMPLE 2

The procedures of Example 2 were repeated, except that no dry air was introduced into the high frequency power introduction portion, to obtain six electrophotographic light receiving members.

For the resultant electrophotographic light receiving members, evaluation was conducted with respect to appearance of defective image comprising white spot(s) in the same manner as in Example 1.

The evaluated result is shown in Table 4 as well as in Example 2.

From the results shown in Table 4, it is understood that Example 2 belonging to the present invention is superior to Comparative Example 2 in terms of the appearance of white spot(s).

EXAMPLE 3

In this example, using the plasma processing apparatus (the film-forming apparatus) shown in FIG. 14 in which the high frequency power introduction means shown in FIG. 13 is installed and in accordance with the foregoing film-forming procedures with the use of the apparatus shown in 14, there were prepared six electrophotographic light receiving members of the configuration shown in FIG. 15 under conditions shown in Table 5.

In this example, a cover made of alumina ceramics and having a blast-processed surface with a roughness of about 42 μm in terms of Rz was provided on the surface of the cathode electrode. And water of 20.5° C. was continuously introduced into the high frequency power introduction portion of the high frequency power introduction means of FIG. 13 at flow rate of 2 l/minute, from the time when glow discharging was first generated, whereby the temperature of the cathode electrode was controlled.

As the porous ceramic material in the high frequency power introduction means, there was used a porous alumina material having a number of pores of 1.2 mm in average diameter at an apparent porosity of 90%.

Figure 17:
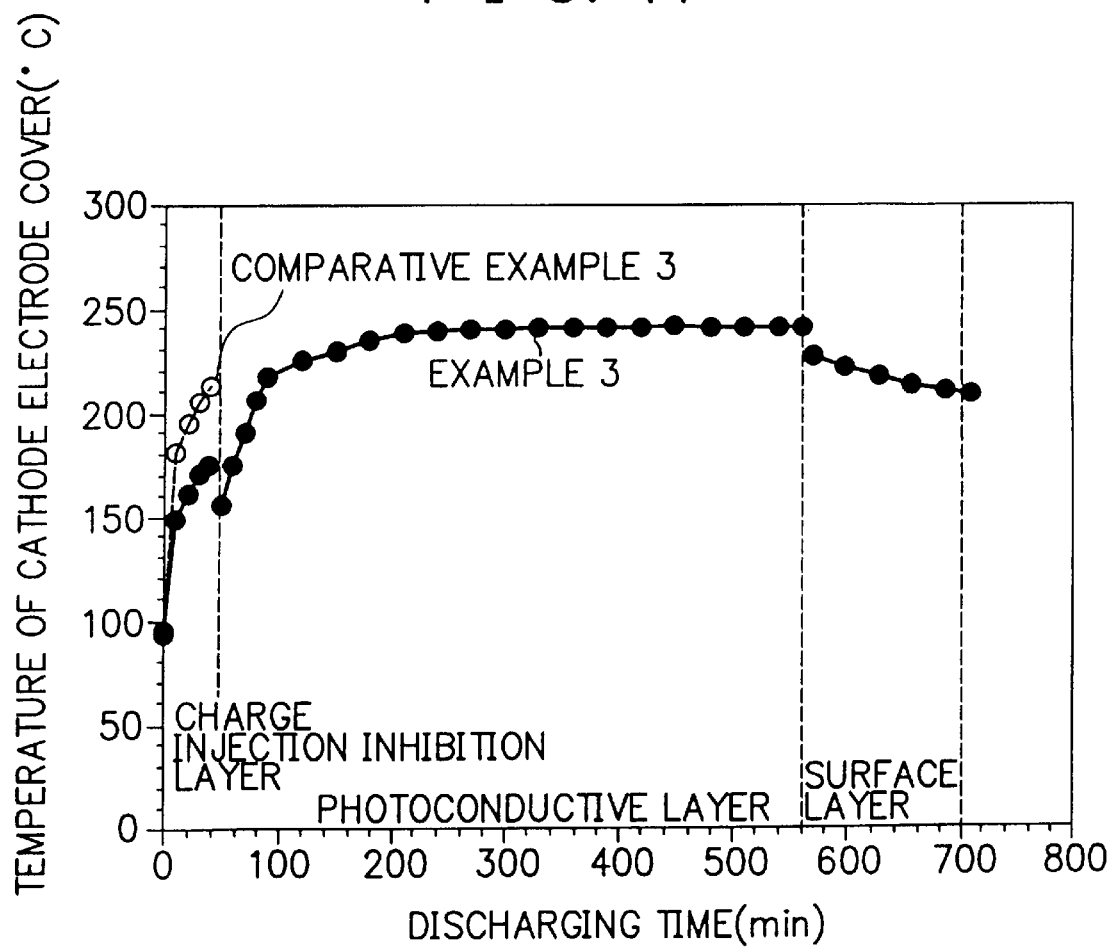
FIG. 17 is a graph showing temperature changes of cathode electrodes' covers in relation to lapse of discharging time.

In this example, during the film formation, the temperature of the cover provided on the surface of the cathode electrode was measured by means of an optical fiber temperature gage provide at a tip portion of said cover. The measured results are graphically shown in FIG. 17.

For the resultant electrophotographic light receiving members, evaluation was conducted with respect to appearance of defective images comprising white spot(s) in the same manner as in Example 1.

The evaluated result is shown in Table 6.

COMPARATIVE EXAMPLE 3

The procedure of Example 3 were repeated, except that no water was introduced into the high frequency power introduction portion, to obtain six electrophotographic light receiving members.

In this comparative example, since the temperature of the cover of the cathode electrode would go beyond the upper limit of temperature for the optical fiber temperature gage to be capable of being used, the temperature measurement of the cathode electrode's cover was conducted only during the formation of the charge injection inhibition layer. The measured results are graphically shown in FIG. 17 as well as in Example 3.

For the resultant electrophotographic light receiving members, evaluation was conducted with respect to appearance of defective images comprising white spot(s) in the same manner as in Example 1.

The evaluated result is shown in Table 6 as well as in Example 3.

From the results shown in Table 6, it is understood even when the cover is provided on the surface of the cathode electrode, there can be attained desired effects of effectively controlling the temperature of the cathode electrode and enabling to produce a high quality electrophotographic member which provides a high quality image which is substantially free of the appearance of white spots.

EXAMPLE 4

In this example, using the plasma processing apparatus (the film-forming apparatus) shown in FIG. 14 in which the high frequency power introduction means shown in FIG. 13 is installed and in accordance with the foregoing film-forming procedures with the use of the apparatus shown in 14, there were prepared six electrophotographic light receiving members of the configuration shown in FIG. 15 under conditions shown in Table 7.

In this example, as the porous ceramic material in the high frequency power introduction means, there was used a porous alumina material having a number of pores of 0.8 mm in average diameter at an apparent porosity of 50%. And the cathode electrode was made to have a blast-processed surface with a roughness of about 35 μm in terms of Rz. Further, in this example, an optical fiber temperature gage was positioned at a tip portion of the cathode electrode.

In addition, in this example, prior to commencing glow discharging, the temperature of the cathode electrode was maintained at 180° C. by introducing heated dry air into the high frequency power introduction portion of the high frequency power introduction means. At the time of commencing the glow discharging, the introduction of the heated dry air was terminated. And during the film formation, the temperature of the cathode electrode was controlled by repeating a cycle of introducing dry air of 25.5° C. into the high frequency power introduction portion at a flow rate of 1 l/second when the temperature of the cathode electrode became 200° C. and terminating the introduction of the dry air when the temperature of the cathode electrode was decreased to 180° C.

For the resultant electrophotographic light receiving members, evaluation was conducted with respect to appearance of defective images comprising white spot(s) in the same manner as in Example 1.

The evaluated result is shown in Table 10.

EXAMPLE 5

The procedures of Example 4 were repeated, except that the layer-forming conditions were changed to those shown in Table 8 and as the porous ceramic material in the high frequency power introduction means, a porous alumina material having a number of pores of 1 mm in average diameter at an apparent porosity of 65% was used, to obtain six electrophotographic light receiving members.

For the resultant electrophotographic light receiving members, evaluation was conducted with respect to appearance of defective images comprising white spot(s) in the same manner as in Example 1.

The evaluated result is shown in Table 10.

EXAMPLE 6

In this example, using the plasma processing apparatus (the film-forming apparatus) shown in FIG. 14 in which the high frequency power introduction means shown in FIG. 13 is installed and in accordance with the foregoing film-forming procedures with the use of the apparatus shown in 14, there were prepared six electrophotographic light receiving members of the configuration shown in FIG. 15 under conditions shown in Table 9.

In this example, as the porous ceramic material in the high frequency power introduction means, there was used a porous boron nitride material having a number of pores of 1.5 mm in average diameter at an apparent porosity of 85%.

Further, in this example, a cover made of alumina ceramics and having a blast-processed surface with a roughness of about 55 μm in terms of Rz was provided on the surface of the cathode electrode. And an optical fiber temperature gage was positioned at a tip portion of the cover of the cathode electrode. Prior to commencing glow discharging, the temperature of the cover of the cathode electrode was maintained at 180° C. by introducing heated dry air into the high frequency power introduction portion of the high frequency power introduction means. At the time of commencing the glow discharging, the introduction of the heated dry air was terminated. And during the film formation, the temperature of the cover of the cathode electrode was controlled by repeating a cycle of introducing water of 20.5° C. into the high frequency power introduction portion at a flow rate of 1 l/minute when the temperature of the cover of the cathode electrode became 200° C. and terminating the introduction of the water when the temperature of the cover of the cathode electrode was decreased to 180° C.

For the resultant electrophotographic light receiving members, evaluation was conducted with respect to appearance of defective images comprising white spot(s) in the same manner as in Example 1.

The evaluated result is shown in Table 10.

Based on results shown in Table 10, it is understood that any of Examples 4 to 6 belonging to the present invention enables one to produce a high quality electrophotographic member which provides a high quality image which is substantially free of the appearance of white spots.

In the plasma processing apparatus (the film-forming apparatus) used in any of Examples 1 to 6 belonging to the present invention, substantially no abnormal discharging occurred during the film formation. This means that the use of any of the high frequency power introduction means enables one to effectively form a high quality deposited film without causing abnormal discharging.

Separately, the value of Rz in any of the above described examples and comparative examples is a value obtained in accordance with a conventional surface roughness (Rz) measuring method wherein for a given uneven surface, an average value among irregularities at 10 points randomly selected on said surface is obtained.

As apparent from the above description, in the present invention, for means for introducing a high frequency power into a reaction chamber, said means comprising a cathode electrode and a conductor portion for transmitting a high frequency power to said cathode electrode, by employing a mechanism capable of effectively controlling the temperature of the cathode and/or that of the conductor portion, there are realized a plasma processing apparatus (or a film-forming apparatus) and a plasma processing method (or a film-forming method) which enable one to effectively form a high quality deposited film while preventing the apparatus from suffering from mechanical damage and preventing abnormal discharging from occurring. This situation enables one to produce a high quality amorphous silicon electrophotographic light receiving member which reproduces a high quality image substantially free of defects comprising white spots.

Further, according to the present invention, the temperature of the cathode electrode can be effectively controlled to a desired temperature during plasma processing and a film deposited on the cathode electrode can be effectively prevented from being peeled off during film formation. This situation enables one to stably and continuously form a high quality deposited film, particularly, a high quality amorphous silicon device.

TABLE 1

|  | charge injection inhibition layer | photoconductive layer | surface layer |
|---|---|---|---|
| gas used and its flow rate |  |  |  |
| $SiH_4$ [SCCM] | 150 | 150 | 100 |
| $B_2H_6$ [ppm] (against $SiH_4$) | 1000 | 2 | — |
| NO [SCCM] | 9 | — | — |
| $CH_4$ [SCCM] | — | — | 500 |
| inner pressure [Pa] | 0.7 | 0.7 | 1.2 |
| high frequency power [W] (105 MHz) | 1000 | 1500 | 600 |
| substrate temperature [° C.] | 250 | 280 | 280 |
| thickness [μm] | 3 | 30 | 0.5 |

TABLE 2

|  | Example 1 | Comparative Example 1 |
|---|---|---|
| appearance of white spot(s) | ⊚ | ○ |

TABLE 3

|  | charge injection inhibition layer | photoconductive layer | surface layer |
|---|---|---|---|
| gas used and its flow rate |  |  |  |
| $SiH_4$ [SCCM] | 250 | 300 | 50 |
| $B_2H_6$ [ppm] (against $SiH_4$) | 2000 | — | — |
| NO [SCCM] | 15 | — | — |
| $CH_4$ [SCCM] | — | — | 500 |
| inner pressure [Pa] | 0.5 | 0.5 | 1 |
| high frequency power [W] (105 MHz) | 1200 | 3000 | 600 |
| substrate temperature [° C.] | 250 | 280 | 280 |
| thickness [μm] | 3 | 25 | 0.5 |

TABLE 4

|  | Example 2 | Comparative Example 2 |
|---|---|---|
| appearance of white spot(s) | ⊚ | ○ |

TABLE 5

|  | charge injection inhibition layer | photoconductive layer | surface layer |
|---|---|---|---|
| gas used and its flow rate |  |  |  |
| $SiH_4$ [SCCM] | 150 | 150 | 50 |
| $B_2H_6$ [ppm] (against $SiH_4$) | 2000 | — | — |

TABLE 5-continued

|  | charge injection inhibition layer | photoconductive layer | surface layer |
|---|---|---|---|
| NO [SCCM] | 15 | — | — |
| CH$_4$ [SCCM] | — | — | 500 |
| inner pressure [Pa] | 0.5 | 0.5 | 1 |
| high frequency power [W] (105 MHz) | 1200 | 2500 | 600 |
| substrate temperature [° C.] | 250 | 280 | 280 |
| thickness [μm] | 3 | 30 | 0.5 |

TABLE 6

|  | Example 3 | Comparative Example 3 |
|---|---|---|
| appearance of white spot(s) | ⊚ | ○ |

TABLE 7

|  | charge injection inhibition layer | photoconductive layer | surface layer |
|---|---|---|---|
| gas used and its flow rate |  |  |  |
| SiH$_4$ [SCCM] | 250 | 325 | 55 |
| B$_2$H$_6$ [ppm] (against SIH$_4$) | 2000 | 2 | — |
| NO [SCCM] | 15 | — | — |
| CH$_4$ [SCCM] | — | — | 800 |
| inner pressure [Pa] | 1 | 1 | 1.5 |
| high frequency power [W] (105 MHz) | 1200 | 3800 | 1000 |
| substrate temperature [° C.] | 250 | 280 | 280 |
| thickness [μm] | 3 | 25 | 0.5 |

TABLE 8

|  | charge injection inhibition layer | photoconductive layer | surface layer |
|---|---|---|---|
| gas used and its flow rate |  |  |  |
| SiH$_4$ [SCCM] | 250 | 325 | 55 |
| B$_2$H$_6$ [ppm] (against SIH$_4$) | 2000 | 2 | — |
| NO [SCCM] | 15 | — | — |
| CH$_4$ [SCCM] | — | — | 800 |
| inner pressure [Pa] | 1 | 1 | 1.5 |
| high frequency power [W] (105 MHz) | 1200 | 1800 | 1000 |
| substrate temperature [° C.] | 250 | 280 | 280 |
| thickness [μm] | 3 | 25 | 0.5 |

TABLE 9

|  | charge injection inhibition layer | photoconductive layer | surface layer |
|---|---|---|---|
| gas used and its flow rate |  |  |  |
| SiH[SCCM] | 130 | 130 | 55 |
| B$_2$H$_6$ [ppm] (against SIH$_4$) | 2000 | 2 | — |

TABLE 9-continued

|  | charge injection inhibition layer | photoconductive layer | surface layer |
|---|---|---|---|
| NO [SCCM] | 15 | — | — |
| CH$_4$ [SCCM] | — | — | 800 |
| inner pressure [Pa] | 1 | 1 | 1.5 |
| high frequency power [W] (105 MHz) | 900 | 1300 | 900 |
| substrate temperature [° C.] | 250 | 280 | 280 |
| thickness [μm] | 3 | 25 | 0.5 |

TABLE 10

|  | Example 4 | Example 5 | Example 6 |
|---|---|---|---|
| appearance of white spot(s) | ⊚ | ⊚ | ⊚ |

What is claimed is:

1. A plasma processing apparatus comprising a reaction chamber capable of being evacuated and which is provided with at least a substrate holding means, a raw material gas introduction means for introducing a raw material gas into said reaction chamber and a high frequency power introduction means for introducing a high frequency power into said reaction chamber in which said raw material gas is decomposed by said high frequency power to form a deposited film on a substrate held by said substrate holding means, wherein said high frequency power introduction means comprises a cathode electrode and a conductor portion capable of transmitting a high frequency power to said cathode electrode, said conductor portion to penetrate a wall of said reaction chamber while said conductor portion is electrically isolated from said wall of said reaction chamber by means of an insulating material, at least a part of said insulating material comprising a porous ceramic material, wherein a fluid is introduced through said porous ceramic material to control the temperature of said cathode electrode and/or that of said conductor portion.

2. A plasma processing apparatus according to claim 1, wherein the high frequency power has an oscillation frequency in the range of 20 MHz to 450 MHz.

3. A plasma processing apparatus according to claim 1, wherein the porous ceramic material has an apparent porosity in the range of 50% to 90%.

4. A plasma processing apparatus according to claim 1, wherein the porous ceramic material is situated around the conductor portion and an outer conductor is provided around the porous ceramic material.

5. A plasma processing apparatus according to claim 4, wherein the outer conductor has an opening for externally introducing the fluid into the porous ceramic material.

6. A plasma processing apparatus according to claim 4, wherein the outer conductor has an opening for discharging the fluid passed through the porous ceramic material.

7. A plasma processing apparatus according to claim 4, wherein the outer conductor and the porous ceramic material are arranged such that they are in close contact with each other.

8. A plasma processing apparatus according to claim 4, wherein the porous ceramic material and the cathode electrode or the conductor portion are arranged such that they are in close contact with each other.

9. A plasma processing apparatus according to claim 1, wherein the inside of the cathode electrode has a space capable of allowing the fluid to be introduced therein.

10. A plasma processing apparatus according to claim 1, wherein the cathode electrode is provided with a pipe, the inner space of the pipe being communicated with a space formed between an inner wall face of the cathode electrode and an exterior face of the pipe.

11. A plasma processing apparatus according to claim 1, wherein a cover is provided on the surface of the cathode electrode.

12. A plasma processing apparatus according to claim 11, wherein the cover is constituted by ceramics.

13. A plasma processing apparatus according to claim 1 which is a film-forming apparatus.

14. A plasma processing apparatus according to claim 1, wherein control of the temperature of the cathode electrode and/or that of the conductor portion is performed outside the reaction chamber.

15. A plasma processing apparatus according to claim 1, wherein the porous ceramic material is provided outside the reaction chamber.

16. A plasma processing apparatus comprising a reaction chamber having an inner space capable of being evacuated, a substrate holding means for arranging a substrate in said inner space, a gas feed means for introducing a gas into said inner space, and a high frequency power introduction means for introducing a high frequency power into said inner space, wherein said plasma processing apparatus is provided with (a) a conductor portion for transmitting said high frequency power wherein said conductor portion penetrates a wall of said reaction chamber and (b) an insulating material for electrically isolating said conductor portion from said wall of said reaction chamber, wherein at least a part of said insulating material (b) comprises a porous ceramic material, said porous ceramic material being provided between a fluid inlet and a fluid outlet.

17. A plasma processing apparatus according to claim 16, wherein the porous ceramic material has an apparent porosity in a range of 50% to 90%.

18. A plasma processing apparatus according to claim 16, wherein an outer conductor is provided around the porous ceramic material.

19. A plasma processing apparatus according to claim 18, wherein the porous ceramic material is provided outside the reaction chamber.

20. A plasma processing apparatus according to claim 16, wherein said plasma processing apparatus is a film-forming apparatus.

21. A plasma processing apparatus according to claim 16, wherein the porous ceramic material is provided outside the reaction chamber.

* * * * *

UNITED STATES PATENT AND TRADEMARK OFFICE
CERTIFICATE OF CORRECTION

PATENT NO. : 6,165,274
DATED : December 26, 2000
INVENTOR(S) : Kazuyoshi Akiyama et al.

It is certified that error appears in the above-identified patent and that said Letters Patent is hereby corrected as shown below:

Title page,
Item [56], FOREIGN PATENT DOCUMENTS,
"07273047" should read -- 7-270347 --.
Item [57], ABSTRACT,
Line 8, "penetrated" should read -- penetrated by --.

Column 1,
Line 6, "relates" should read -- relates to --;
Line 8, "deposed" should read -- deposited --;
Line 9, "deposed" should read -- deposited --;
Line 10, "amorphous" should read -- production of amorphous --;
Line 44, "document," should read -- this document --;
Line 60, "In the" should read -- The --.

Column 2,
Line 34, "device" should read -- devices --;
Line 35, "as a" should read -- as --; and "device)" should read -- devices) --;
Line 37, "more" should be deleted;
Line 54, "to the" should read -- to --.

Column 3,
Line 10, "material," should read -- material --;
Line 26, "occurrs" should read -- occurs --;
Line 29, "nucleuses" should read -- nuclei --;
Line 67, "to prevent" should read -- preventing --.

Column 4,
Line 4, "to a" should read -- to provide a --;
Line 26, "aid" should read -- said --;
Line 51, "being" should read -- is --.

Column 6,
Line 21, "improved" should read -- improves --;
Line 24, "burned" should read -- burns --;
Line 26, "ratus" should read -- ratus, --;
Line 38, "reproduce" should read -- reproduces --.

Column 7,
Line 19, "connected" should read -- connected to --;
Line 44, "gage" should read -- gauge --.

UNITED STATES PATENT AND TRADEMARK OFFICE
CERTIFICATE OF CORRECTION

PATENT NO. : 6,165,274
DATED : December 26, 2000
INVENTOR(S) : Kazuyoshi Akiyama et al.

It is certified that error appears in the above-identified patent and that said Letters Patent is hereby corrected as shown below:

Column 8,
Line 29, "deviated" should read -- deviated from --;
Line 33, "flow" should read -- flows --;
Line 56, "greater" should read -- better --;
Line 59, "situation," should read -- situation --.

Column 9,
Line 34, "situation," should read -- situation --.

Column 10,
Line 49, "conditions," should read -- conditions --;
Line 56, "above" should read -- above are --.

Column 11,
Line 20, "case" should read -- the case --;
Line 47, "gage" should read -- gauge --;
Line 56, "10" should read -- at 10 --.

Column 12,
Line 62, "to" should be deleted.

Column 13,
Line 5, "porous" should read -- "porous" --;
Line 24, "in the viewpoints" should read -- in --;
Line 47, "sighted" should read -- be sighted --;
Line 51, "be" should be deleted;
Line 51, "occurred" should read -- occur --;
Line 52, "a" should be deleted;
Line 55, "a" should be deleted.

Column 14,
Line 5, "where" should read -- of --;
Line 41, "passes" should read -- passes through --.

Column 15,
Line 35, "headed" should read -- heated --;
Line 46, "comprising" should read -- comprises --;
Line 52, "each a heater" should read -- each heater --.

UNITED STATES PATENT AND TRADEMARK OFFICE
CERTIFICATE OF CORRECTION

PATENT NO. : 6,165,274
DATED : December 26, 2000
INVENTOR(S) : Kazuyoshi Akiyama et al.

It is certified that error appears in the above-identified patent and that said Letters Patent is hereby corrected as shown below:

Column 16,
Line 13, "electrophotgraphic" should read -- electrophotographic --;
Line 23, "gage" should read -- gauge --;
Line 36, "gage," should read -- gauge, --;
Line 45, "whereby" should read -- thereby --;
Line 50, "reached" should read -- reaches --;
Line 55, "whereby" should read -- thereby --.

Column 17,
Line 41, "may" should read -- may be --;
Line 58, "belonging" should read -- belonging to --.

Column 18,
Line 51, "of" should read -- or --.

Column 19,
Line 60, "not" should read -- is not --;
Line 62, "and" should read -- and is --.

Column 20,
Line 41, "14," should read -- FIG. 14, --.

Column 21,
Line 26, "20.5°" should read -- 20.4° --;
Line 40, "gage" should read -- gauge --; and "provide" -- provided --;
Line 55, "gage" should read -- gauge --.

Column 22,
Line 24, "gage" should read -- gauge --.

UNITED STATES PATENT AND TRADEMARK OFFICE
CERTIFICATE OF CORRECTION

PATENT NO.   : 6,165,274
DATED        : December 26, 2000
INVENTOR(S)  : Kazuyoshi Akiyama et al.

It is certified that error appears in the above-identified patent and that said Letters Patent is hereby corrected as shown below:

Column 23,
Line 10, "gage" should read -- gauge --;
Line 13, "glow" should read -- flow --;
Line 17, "glow" should read -- flow --;
Line 31, "on" should read -- on the --.

Column 25,
Table 9, "SiH[SCCM]" should read -- $SiH_4$ [SCCM] --.

Signed and Sealed this

First Day of April, 2003

JAMES E. ROGAN
*Director of the United States Patent and Trademark Office*